US010269300B2

(12) United States Patent
Xiang et al.

(10) Patent No.: US 10,269,300 B2
(45) Date of Patent: Apr. 23, 2019

(54) ORGANIC LIGHT-EMITTING DISPLAY PANEL, DRIVING METHOD THEREOF, AND ORGANIC LIGHT-EMITTING DISPLAY DEVICE

(71) Applicant: Shanghai Tianma AM-OLED Co., Ltd., Shanghai (CN)

(72) Inventors: Dongxu Xiang, Shanghai (CN); Yue Li, Shanghai (CN); Dong Qian, Shanghai (CN); Gang Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 53 days.

(21) Appl. No.: 15/486,424

(22) Filed: Apr. 13, 2017

(65) Prior Publication Data

US 2017/0221423 A1 Aug. 3, 2017

(30) Foreign Application Priority Data

Jan. 6, 2017 (CN) .......................... 2017 1 0009894

(51) Int. Cl.
*G09G 3/3291* (2016.01)
*G09G 3/3258* (2016.01)
(Continued)

(52) U.S. Cl.
CPC ......... *G09G 3/3291* (2013.01); *G09G 3/3233* (2013.01); *G09G 3/3266* (2013.01);
(Continued)

(58) Field of Classification Search
CPC combination set(s) only.
See application file for complete search history.

(56) References Cited

U.S. PATENT DOCUMENTS 9,035,976 B2 5/2015 Lee et al.
2009/0278452 A1* 11/2009 Kim ...................... H01L 25/048 313/504
(Continued)

FOREIGN PATENT DOCUMENTS

CN 1845229 A 10/2006
CN 201293893 Y 8/2009
(Continued)

*Primary Examiner* — Jennifer Mehmood
*Assistant Examiner* — Deeprose Subedi
(74) *Attorney, Agent, or Firm* — Anova Law Group, PLLC

(57) ABSTRACT

An organic light-emitting display panel, driving method thereof, and an organic light-emitting display device are provided. The organic light-emitting display panel comprises a plurality of pixel driving circuits including a first, a second and a third pixel driving circuits along a row direction. The first and the second pixel driving circuits share a same reference voltage signal line. The second and the third pixel driving circuits share a same data voltage signal line. A plurality of reference voltage signal lines is connected to the plurality of pixel driving circuits. A plurality of data voltage signal lines is connected to the plurality of pixel driving circuits. A first control signal line is connected to the first and third pixel driving circuits. A second control signal line is connected to the second pixel driving circuit. A light-emitting control signal line is connected to the first, second, and third pixel driving circuits.

19 Claims, 15 Drawing Sheets

(51) Int. Cl.

| | |
|---|---|
| ***G11C 27/04*** | (2006.01) |
| ***H01L 27/32*** | (2006.01) |
| ***G09G 3/3233*** | (2016.01) |
| ***G09G 3/3266*** | (2016.01) |

(52) U.S. Cl.

CPC ............... *G09G 2300/0426* (2013.01); *G09G 2300/0465* (2013.01); *G09G 2300/0819* (2013.01); *G09G 2300/0842* (2013.01); *G09G 2300/0861* (2013.01); *G09G 2310/0286* (2013.01); *G09G 2320/0233* (2013.01); *G09G 2320/0295* (2013.01)

(56) References Cited

U.S. PATENT DOCUMENTS

| | | | | |
|---|---|---|---|---|
| 2014/0022289 | A1* | 1/2014 | Lee ...................... | G09G 3/3283 345/691 |
| 2014/0035895 | A1* | 2/2014 | Toyomura ............ | G09G 3/3611 345/211 |
| 2014/0300281 | A1* | 10/2014 | Chaji ................... | G09G 3/3233 315/161 |

FOREIGN PATENT DOCUMENTS

| | | | |
|---|---|---|---|
| CN | 104123912 | A | 10/2014 |
| CN | 104505024 | A | 4/2015 |
| CN | 105096766 | A | 11/2015 |
| CN | 104123912 | B | 10/2016 |

* cited by examiner

600

ORGANIC LIGHT-EMITTING DISPLAY PANEL, DRIVING METHOD THEREOF, AND ORGANIC LIGHT-EMITTING DISPLAY DEVICE

CROSS-REFERENCES TO RELATED APPLICATIONS

This application claims priority of Chinese Patent Application No. 201710009894.4, filed on Jan. 6, 2017, the entire contents of which are hereby incorporated by reference.

FIELD OF THE DISCLOSURE

The present disclosure generally relates to the field of display technology and, more particularly, relates to an organic light-emitting display panel, a driving method thereof, and an organic light-emitting display device.

BACKGROUND

With the continuous development of display technologies, the dimension of display devices changes constantly. To satisfy the portability requirements of electronic devices, demands on the display screens with a relatively small dimension increase continuously.

Further, users also proposed higher requirements on the display quality of the display screens. For example, the users tend to choose a display screen with high pixel per inch (PPI) that delivers improved display accuracy and continuity.

Organic light-emitting diode (OLED) displays are more and more widely applied in various kinds of portable electronic devices because of features such as a light weight and thin thickness, as well as being power efficient, etc. An OLED display often includes an array of organic light-emitting diodes (i.e., a pixel array), a plurality of driving circuits (i.e., pixel circuits) configured to supply a driving current to each organic light-emitting diode in the array, and a scanning circuit configured to supply a driving signal to each pixel circuit, etc.

However, in existing pixel circuits, because of issues regarding the circuit structure, each column of pixel circuits may need one data voltage signal line and one reference voltage signal line. Often, the data voltage signal line and the reference voltage signal line extend along a column direction (a longitudinal direction) of the pixel array. That is, for an organic light-emitting display panel having an M rows×N columns pixel array, a total number of 2N longitudinal wires are needed. As such, the number of longitudinal wires in the display panel may be relatively large, thereby preventing the implementation of high PPI organic light-emitting display panels.

The disclosed organic light-emitting display panel, driving method thereof, and organic light-emitting display device are directed to solving at least partial problems set forth above and other problems.

BRIEF SUMMARY OF THE DISCLOSURE

One aspect of the present disclosure provides an organic light-emitting display panel. The organic light-emitting display panel includes a pixel array including a plurality of pixel regions. The plurality of pixel driving circuits includes, along a row direction of the pixel array, a first pixel driving circuit, a second pixel driving circuit, and a third pixel driving circuit in a preset order. The first and the second pixel driving circuits share a same reference voltage signal line, and the second and the third pixel driving circuits share a same data voltage signal line. A plurality of reference voltage signal lines is configured to provide a reference voltage signal to the plurality of pixel driving circuits. A plurality of data voltage signal lines is configured to provide a data signal to the plurality of pixel driving circuits. A first control signal line is connected to the first and third pixel driving circuits. A second control signal line is connected to the second pixel driving circuit. A light-emitting control signal line is connected to the first, the second, and the third pixel driving circuits.

Another aspect of the present disclosure provides a driving method of an organic light-emitting display panel. The organic light-emitting display panel includes a first pixel driving circuit, a second pixel driving circuit, a third pixel driving circuit, and a plurality of reference voltage signal lines connected to the first, the second and the third pixel driving circuits. The organic light-emitting display panel includes further includes a plurality of data voltage signal lines connected to the first, the second and the third pixel driving circuits, a first control signal line connected to the first and the third pixel driving circuits, a second control signal line connected to the second pixel driving circuit, and a light-emitting control signal line connected to the first, the second, and the third pixel driving circuits. The driving method comprises supplying a reference voltage signal to the plurality of reference voltage signal lines. The driving method further comprises, in a first stage, supplying a first voltage level signal to the first control signal line, supplying a second voltage level signal to the second control signal line and the light-emitting signal line, and supplying a first initialization signal to the plurality of data voltage signal lines, such that initialization and threshold detection of the second pixel driving circuit is fulfilled. The driving method further comprises, in a second stage, supplying the first voltage level signal to the first control signal line and the light-emitting control signal line, supplying the second voltage level signal to the second control signal line, and supplying a first data signal obtained after a threshold voltage of a driving transistor in the second pixel driving circuit is compensated to the plurality of data voltage signal line.

Another aspect of the present disclosure provides a driving method of an organic light-emitting display panel. The organic light-emitting display panel includes a first pixel driving circuit, a second pixel driving circuit, a third pixel driving circuit, and a plurality of reference voltage signal lines connected to the first, the second and the third pixel driving circuits. The organic light-emitting display panel includes further includes a plurality of data voltage signal lines connected to the first, the second and the third pixel driving circuits, a first control signal line connected to the first and the third pixel driving circuits, a second control signal line connected to the second pixel driving circuit, and a light-emitting control signal line connected to the first, the second, and the third pixel driving circuits. The driving method includes supplying a reference voltage signal to a plurality of reference voltage signal lines. The driving method further includes, in a first collection phase of a threshold detection stage, supplying a first voltage level signal to the first control signal line, supplying a second voltage level signal to the second control signal line and the light-emitting signal line, and supplying a first initialization signal to the plurality of data voltage signal lines. The driving method further includes, in a second collection phase of the threshold detection stage, supplying the second voltage level signal to the first control signal line and the light-emitting signal line, supplying the first voltage level signal to the second control signal line, and supplying the first initialization signal to the plurality of data voltage signal lines.

Other aspects of the present disclosure can be understood by those skilled in the art in light of the description, the claims, and the drawings of the present disclosure.

BRIEF DESCRIPTION OF THE DRAWINGS

Other features, goals, and advantages of the present disclosure will become more apparent via a reading of detailed descriptions of non-limiting embodiments with reference to the accompanying drawings.

DETAILED DESCRIPTION

Reference will be made in detail with reference to embodiments of the present disclosure as illustrated in the accompanying drawings and embodiments. It should be understood that, specific embodiments described herein are only for illustrative purposes, and are not intended to limit the scope of the present disclosure. In addition, for case of description, accompanying drawings only illustrate a part of, but not entire structure related to the present disclosure.

It should be noted that when there is no conflict, disclosed embodiments and features of the disclosed embodiments may be combined with each other. Hereinafter, the present disclosure is illustrated in detail with reference to embodiments thereof as illustrated in the accompanying drawings.

The present disclosure provides an organic light-emitting display panel including a pixel array, a plurality of pixel driving circuits, a plurality of reference voltage signal lines and a plurality of data voltage signal lines. Optionally, the organic light-emitting display panel may further include a plurality of first control signal lines, a plurality of second control signal lines, and a plurality of light-emitting control signal lines.

More specifically, the pixel array may include N rows and M columns of pixel regions. Further, each pixel driving circuit may include a light-emitting element (e.g., a light-emitting diode) and a driving transistor configured to drive the light-emitting element. Each light-emitting element may be located within a pixel region. In one embodiment, each pixel driving circuit may have one-to-one correspondence to a pixel region. That is, in each pixel region, a pixel driving circuit corresponding to the pixel region may be configured.

Optionally, in some other embodiments, pixel driving circuits in adjacent pixel regions may share a part of electrical or electronic elements, such as the driving transistor. By supplying a signal (e.g., a data signal) to the driving transistor time-sharingly, the light-emitting elements (e.g., the LEI)) in the adjacent pixel regions may be lightened up (i.e., emit light), respectively.

Further, the plurality of pixel driving circuits in the disclosed organic light-emitting display panel may include a first pixel driving circuit, a second pixel driving circuit, and a third pixel driving circuit. The plurality of reference voltage signal lines may be configured to supply reference voltage signals to the plurality of pixel driving circuits. The plurality of data voltage signal lines may be configured to supply data signals to the plurality of pixel driving circuits. The plurality of light-emitting control signal lines may be configured to supply light-emitting control signals to the plurality of pixel driving circuits.

Figure 1:
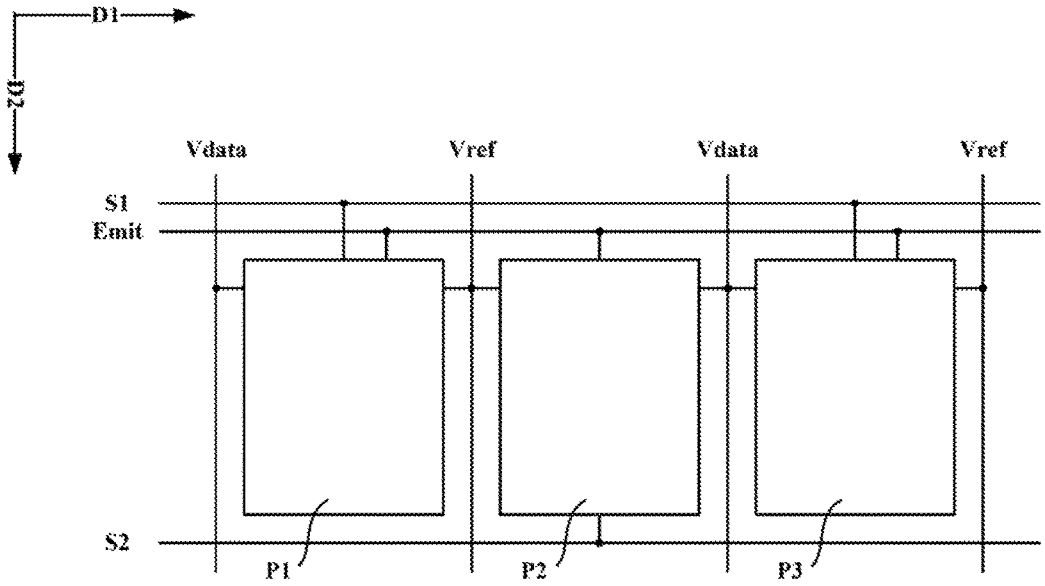
FIG. 1 illustrates an exemplary structural schematic view of a first pixel driving circuit, a second pixel driving circuit and a third pixel driving circuit in an organic light-emitting display panel according to embodiments of the present disclosure.

FIG. 1 illustrates an exemplary structural schematic view of a first pixel driving circuit, a second pixel driving circuit and a third pixel driving circuit included in an organic light-emitting display panel according to embodiments of the present disclosure. As shown in FIG. 1, the organic light-emitting display panel may include a first pixel driving circuit P1, a second pixel driving circuit P2, and a third pixel driving circuit P3, etc.

The organic light-emitting display panel may further include two reference voltage signal lines Vref, and two data voltage signal lines Vdata. Optionally, the organic light-emitting display panel may further include a first control signal line S1, a second control signal line S2, and a light-emitting control signal line Emit.

More specifically, the first pixel driving circuit P1 may be disposed adjacent to the second pixel driving circuit P2 along a row direction D1 of a pixel array, and the second pixel driving circuit P2 may be disposed adjacent to the third pixel driving circuit P3 along the row direction D1 of the pixel array. The two data voltage signal lines Vdata may be arranged along a row direction D1 and extend along a column direction D2. The row direction D1 may intersect with the column direction D2. For example, the row direction D1 may be perpendicular to the column direction D2.

Further, the two reference voltage signal lines Vref may be arranged along the row direction D1 and extend along the column direction D2. In one embodiment, as shown in FIG. 1, the reference voltage lines Vref and the data voltage signal lines Vdata may be arranged alternately along the row direction D1.

Further, the first pixel driving circuit P1 and the second pixel driving circuit P2 may share a same reference voltage signal line Vref. The third pixel driving circuit P3 may be electrically connected to the other voltage signal line Vref. The second pixel driving circuit P2 and the third pixel driving circuit P3 may share a same data voltage signal line Vdata. The first pixel driving circuit P1 may be electrically connected to the other data voltage signal line Vdata.

Optionally, the first control signal line S1, the second control signal line S2, and the light-emitting control signal line Emit may be arranged along the column direction D2 and extend along the row direction D1. Further, the first pixel driving circuit P1 and the third pixel driving circuit P3 may be connected to the first control signal line S1, and the second pixel driving circuit P2 may be connected to the second control signal line S2. The first pixel driving circuit P1, the second pixel driving circuit P2, and the third pixel driving circuit P3 may be connected to the light-emitting control signal line Emit.

Further, the first pixel driving circuit P1 and the third pixel driving circuit P3 may be configured to receive a reference voltage signal and a data signal based on control of a first control signal inputted by the first control signal line S1 and a light-emitting control signal inputted by the light-emitting control signal line Emit. Accordingly, the first pixel driving circuit P1 and the third pixel driving circuit P3 may control the light-emitting element in the first pixel driving circuit P1 and the light-emitting element in the third pixel driving circuit P3 to emit light.

Further, the second pixel driving circuit P2 may be configured to receive a reference voltage signal and a data signal based on control of a first control signal inputted by the second control signal line S2 and a light-emitting control signal inputted by the light-emitting control signal line Emit. Accordingly, the second pixel driving circuit P2 may control the light-emitting element (e.g., a light-emitting diode) in the second pixel driving circuit P2 to emit light.

More specifically, in the first pixel driving circuit P1, the second pixel driving circuit P2, and the third pixel driving circuit P3 illustrated in FIG. 1, the first pixel driving circuit P1 and the third pixel driving circuit P3 may be configured to control data signal write-in in response to the first control signal inputted by the first control signal line S1. The second pixel driving circuit P2 may be configured to control data signal write-in in response to the second control signal inputted by the second control signal line S2.

Further, the light-emitting control signal inputted by the light-emitting control signal line may simultaneously control the light-emitting elements (e.g., the light-emitting diodes) in the first pixel driving circuit P1, the second pixel driving circuit P2, and the third pixel driving circuit P3 to emit light.

As described above, in the first pixel driving circuit P1, the second pixel driving circuit P2, and the third pixel driving circuit P3 illustrated in FIG. 1, only two data voltage signal lines and two reference voltage signal lines may be needed. If each pixel driving circuit (P1, P2 or P3) corresponds to one individual data voltage signal line and one individual reference voltage signal line, three data voltage signal lines and three reference voltage signal lines may be needed.

Accordingly, by using the disclosed organic light-emitting display panel including the first pixel driving circuit P1, the second pixel driving circuit P2, and the third pixel driving circuit P3, the number of the data voltage signal lines and the number of the reference voltage signal lines may be reduced.

The reduction in the number of the data voltage signal lines and the number of reference voltage signal lines may facilitate the realization of an organic light-emitting display panel with high PPI. Further, during operation, the reference voltage signal line may be configured to carry a constant reference voltage signal. That is, the reference voltage signal carried by the reference voltage signal line may remain constant.

Accordingly, the load of the reference voltage signal line may be decreased, and the power consumption of the organic light-emitting display panel may be reduced. Further, the display unevenness induced by voltage drop in the reference voltage signal line Vref may be avoided.

Figure 11:
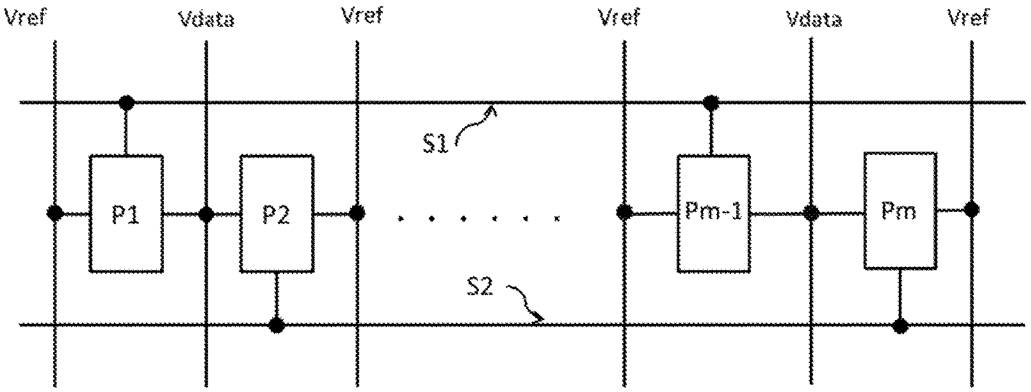
FIG. 11 illustrates an exemplary structural schematic view of a first row of pixel driving circuits of an organic light-emitting display panel according to embodiments of the present disclosure.
Figure 12:
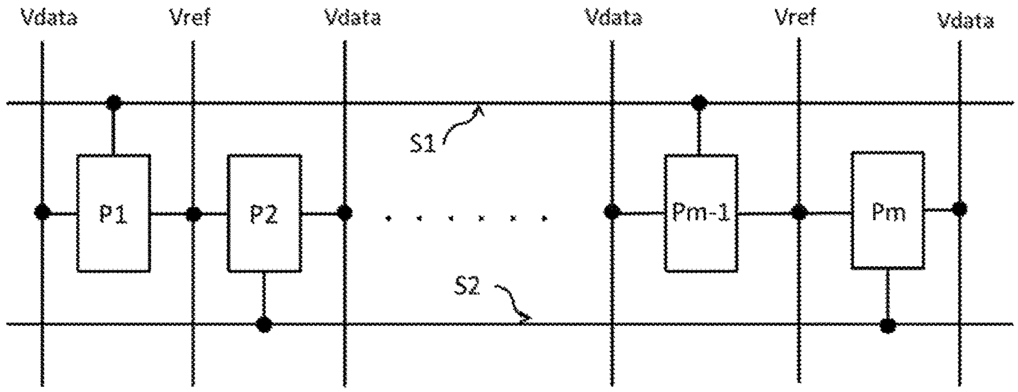
FIG. 12 illustrates another exemplary structural schematic view of a first row of pixel driving circuits of an organic light-emitting display panel according to embodiments of the present disclosure.

FIG. 11 illustrates an exemplary structural schematic view of a first row of pixel driving circuits of an organic light-emitting display panel according to embodiments of the present disclosure. FIG. 12 illustrates another exemplary structural schematic view of a first row of pixel driving circuits of an organic light-emitting display panel according to embodiments of the present disclosure.

As shown in FIG. 11 and FIG. 12, similar to FIG. 1, the organic light-emitting display panel may include an m-number of pixel driving circuits (P1~Pm), a plurality of reference voltage signal lines Vref, and a plurality of data voltage signal lines Vdata, where m is an integer greater than 1 The organic light-emitting display panel may further include a first control signal line S1, and a second control signal line S2. Each pixel driving circuit may be electrically connected to the first control signal line S1 or the second control signal line S2.

Further, instead of each pixel driving circuit being connected to one reference voltage signal line and one data voltage signal line, two adjacent pixel driving circuits may share one data voltage signal line or one reference voltage signal line. Accordingly, the total number of data voltage signal lines and the reference voltage signal lines may be reduced from 2m to (m+1). Thus, the difficulty in fabricating an organic light-emitting display panel with high PPI may be reduced.

Figure 2:
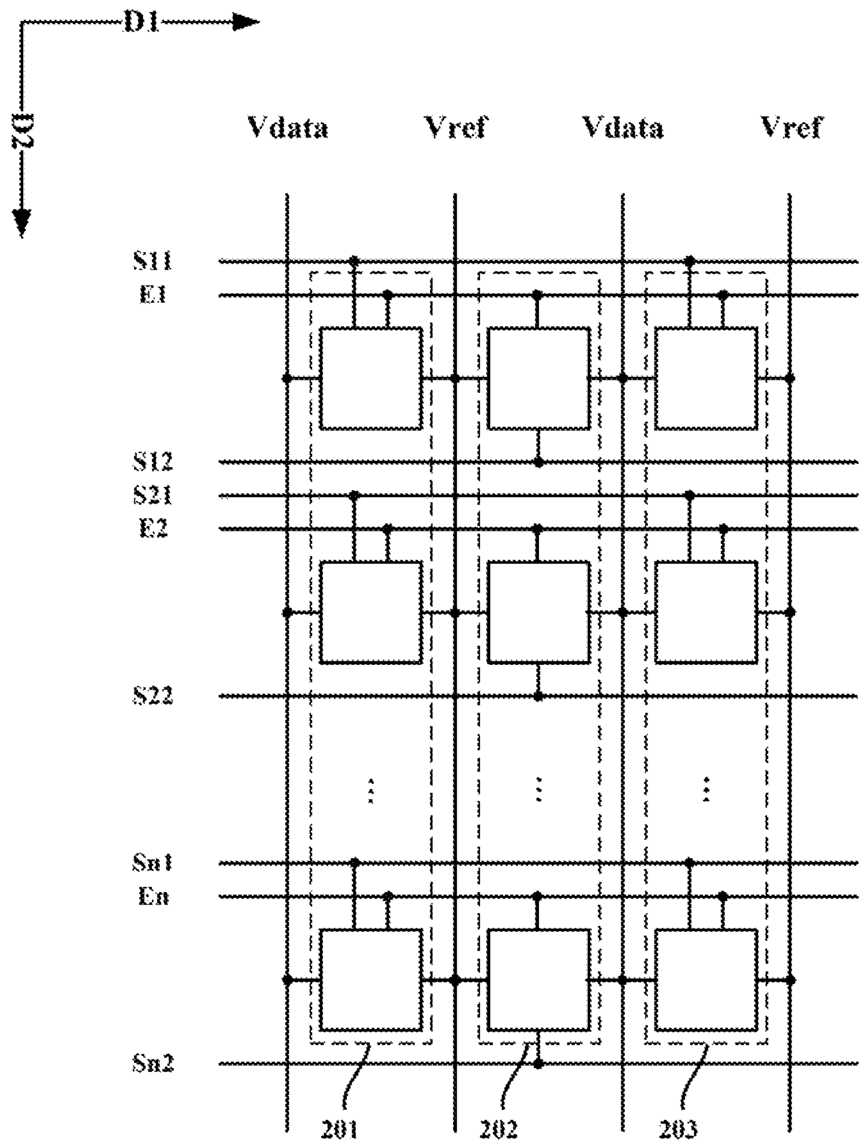
FIG. 2 illustrates an exemplary structural schematic view of a first pixel column, a second pixel column, and a third pixel column in an organic light-emitting display panel according to embodiments of the present disclosure.

FIG. 2 illustrates an exemplary structural schematic view of a pixel sub-array including a first pixel column, a second pixel column, and a third pixel column in an organic light-emitting display panel according to embodiments of the present disclosure. As shown in FIG. 2, the pixel sub-array may include a first pixel column 201, a second pixel column 202, and a third pixel column 203. At least one such pixel sub-array illustrated in FIG. 2 may be included in the pixel array of the organic light-emitting display panel.

More specifically, the first pixel column 201 may be disposed adjacent to the second pixel column 202 along the row direction D1, and the second pixel column 202 may be disposed adjacent to the third pixel column 203 along the row direction D1. Further, each pixel column may include a plurality of pixel regions. In one embodiment, as shown in FIG. 2, the first pixel column 201, the second pixel column 202, and the third pixel column 203 may each include an n-number of pixel regions, where n is a positive integer. The n-number of pixel regions may be arranged along a column direction D2.

Further, as shown in FIG. 2, the organic light-emitting display panel may further include a plurality of first control signal lines (S11, S21, . . . , Sn1), a plurality of second control signal lines (S12, S22, . . . , Sn2), and a plurality of light-emitting control signal lines (E1, E2, . . . , En). Optionally, in one embodiment, the organic light-emitting display panel may further include two reference voltage signal lines Vref and two data voltage signal lines Vdata.

Further, a first pixel driving circuit may be configured to drive a pixel region in the first pixel column 201, a second pixel driving circuit may be configured to drive a pixel region in the second pixel column 202, and a third pixel driving circuit may be configured to drive a pixel region in the third pixel column 203.

In one embodiment, a first pixel driving circuit may be disposed in each pixel region of the first pixel column 201, a second pixel driving circuit may be disposed in each pixel region of the second pixel column 202, and a third pixel driving circuit may be disposed in each pixel region of the third pixel column 203.

Further, each pixel driving circuit configured to drive a pixel region in each pixel column may, under the control of the first control signal, the second control signal, and the light-emitting control signal, receive a reference voltage signal transmitted by the reference voltage signal line and time-sharingly receive a data signal transmitted by the data voltage signal line. More specifically, in the first pixel column 201, the first pixel driving circuit located in a pixel region in the first row may be configured to control data signal write-in based on a first control signal inputted by the first control signal line S11.

Similarly, in the second pixel column 202, the second pixel driving circuit located in the pixel region in the first row may be configured to control data signal write-in based on a second control signal inputted by the second control signal line S12. Further, in the third pixel column 203, the third pixel driving circuit located in the pixel region in the first row may be configured to control data signal write-in based on the first control signal inputted by the first control signal line S11.

Further, in the first pixel column 201, the second pixel region 202, and the third pixel region 203, each pixel driving circuit in the first row of pixel regions may be configured to control the light-emitting element (e.g., light-emitting diode) in each corresponding pixel region to simultaneously emit light based on a light-emitting control signal inputted by the light-emitting control signal line E1.

Similarly, in the first pixel column 201, the first pixel driving circuit located in a pixel region in the second row may be configured to control data signal write-in based on a first control signal inputted by the first control signal line S21. In the second pixel column 202, the second pixel driving circuit located in a pixel region in the second row may be configured to control data signal write-in based on a second control signal inputted by the second control signal line S22. In the third pixel column 203, the third pixel driving circuit located in a pixel region in the second row may be configured to control data signal write-in based on the first control signal inputted by the first control signal line S21.

Further, in the first pixel column 201, the second pixel region 202, and the third pixel region 203, each pixel driving circuit in the second row of pixel regions may be configured to control the light-emitting element (e.g., light-emitting diode) in each corresponding pixel region to simultaneously emit light based on a light-emitting control signal inputted by the light-emitting control signal line E2.

That is, in the first pixel column 201, the first pixel driving circuit located in a pixel region in an $n^{th}$ row may be configured to control data signal write-in based on a first control signal inputted by the first control signal line Sn1. In the second pixel column 202, the second pixel driving circuit located in a pixel region in the $n^{th}$ row may be configured to control data signal write-in based on a second control signal inputted by the second control signal line Sn2. In the third pixel column 203, the third pixel driving circuit located in a pixel region in the $n^{th}$ row may be configured to control data signal write-in based on the first control signal inputted by the first control signal line Sn1.

Further, in the first pixel column 201, the second pixel region 202, and the third pixel region 203, each pixel driving circuit in the $n^{th}$ row of pixel regions may be configured to control the light-emitting element (e.g., light-emitting diode) in each corresponding pixel region to simultaneously emit light based on a light-emitting control signal inputted by the light-emitting control signal line En.

Further, the pixel driving circuits in the same column of pixel regions may share a reference voltage signal line Vref and share a data voltage signal line Vdata to transmit the reference voltage signal and the data signal, respectively. Further, the adjacent columns of pixel regions may share a reference voltage signal line Vref (e.g., the first pixel column 201 and the second pixel column 202) or a data voltage signal line Vdata (e.g., the second pixel column 202 and the third pixel column 203).

Accordingly, in the organic light-emitting display panel, the number of reference voltage signal lines Vref and the number of data voltage signal lines Vdata may be reduced, thereby facilitating the implementation of organic light-emitting display panels with high PPI. Further, during operation, the reference voltage signal carried by the reference voltage signal line Vref may remain constant, thereby reducing the load of the reference voltage signal line and reducing the power consumption of the organic light-emitting display panel.

Figure 3A:
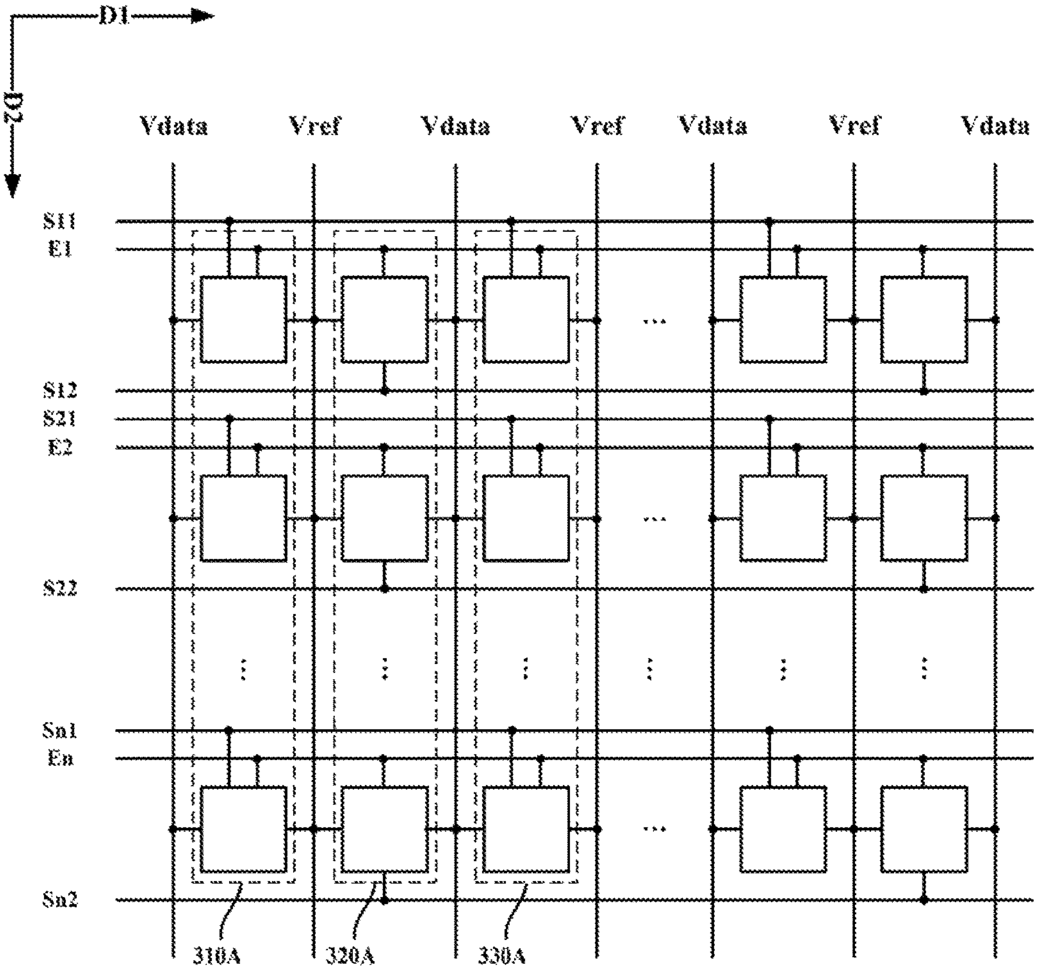
FIG. 3A illustrates an exemplary organic light-emitting display panel according to embodiments of the present disclosure.
Figure 3B:
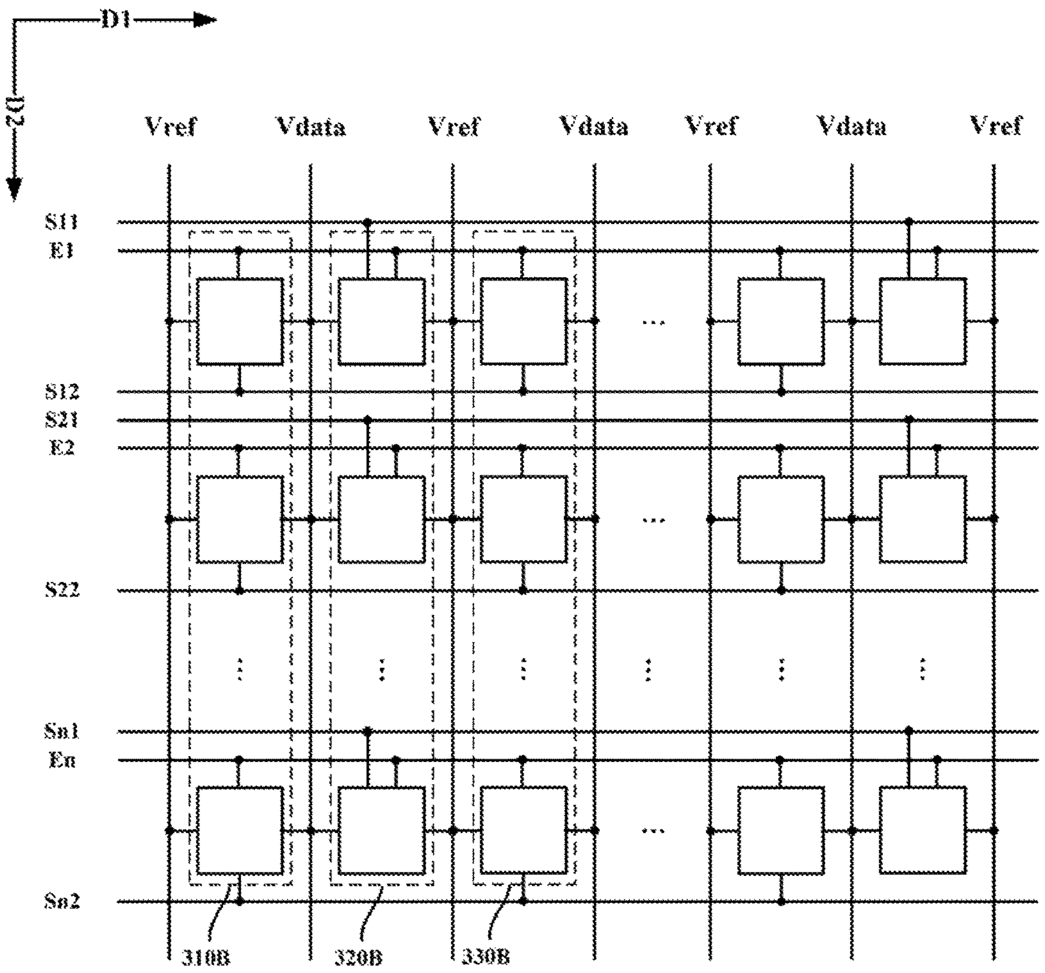
FIG. 3B illustrates an optional implementation of an organic light-emitting display panel in FIG. 3A.

FIG. 3A illustrates an exemplary organic light-emitting display panel according to embodiments of the present disclosure. FIG. 3B illustrates another exemplary organic light-emitting display panel according to embodiments of the present disclosure. As shown in FIG. 3A and FIG. 3B, the organic light-emitting display panel may include a pixel array, a plurality of pixel driving circuits, a plurality of reference voltage signal lines Vref, and a plurality of data voltage signal lines Vdata. Optionally, the organic light-emitting display panel may further include a plurality of first control signal lines (S11, S21, . . . , Sn1), a plurality of second control signal lines (S12, S22, . . . , Sn2), and a plurality of light-emitting control signal lines (E1, E2, . . . , En).

More specifically, the pixel array may include N rows and M columns of pixel regions. Each pixel driving circuit may include a light-emitting element (e.g., a LED) and a driving transistor configured to drive the light-emitting element. Further, each light-emitting element may be disposed in a corresponding pixel region. Further, the plurality of reference voltage signal lines Vref may be configured to supply a reference voltage signal to each pixel driving circuit. The plurality of data voltage signal lines Vdata may be configured to supply a data signal to each pixel driving circuit.

Optionally, the plurality of first control signal lines may be configured to supply a first control signal to each pixel driving circuit. The plurality of second control signal lines may be configured to supply a second control signal to each pixel driving circuit.

Further, in the disclosed organic light-emitting display panel, any pixel column in the pixel array may be one of a first pixel column, a second pixel column, and a third pixel column, where the first pixel column is not adjacent to the third pixel column. As such, the arrangement of the pixel arrays may refer to FIG. 3A. That is, a first column 310A of the pixel array may be a first pixel column, a second column 320A of the pixel array may be a second pixel column, and a third column 330A of the pixel array may be a third pixel column (or the first pixel column).

Further, the first pixel column and the second pixel column may share the same reference voltage signal line Vref, and the second pixel column and the third pixel column may share the same data voltage signal line Vdata. Accordingly, as shown in FIG. 3A, the first column 310A and the second column 320A may share the same reference voltage signal line Vref, and the second column 320A and the third column 330A may share the same data voltage signal line Vdata.

Further, in one embodiment, a pixel driving circuit in the first column 310A and a pixel driving circuit in the third column 330A that are in the same row may be electrically connected to the same first control signal line. A pixel driving circuit in the second column 320A may be electrically connected to a second control signal line. The pixel driving circuit in the first column 310A, the pixel driving circuit in the second column 320A, and the pixel driving circuit in the third column 330A that are in the same row may be electrically connected to the same light-emitting control signal line.

More specifically, for example, a pixel driving circuit in the first column 310A and a pixel driving circuit in the third column 330A that are in an $n^{th}$ row may be electrically connected to the same first control signal line Sn1. A pixel driving circuit in the second column 320A that is in the $n^{th}$ row may be electrically connected to the second control signal line Sn2. Further, the pixel driving circuit in the first column 310A, the pixel driving circuit in the second column 320A, and the pixel driving circuit in the third column 330A in the $n^{th}$ row may be electrically connected to the light-emitting control signal line En.

Optionally, in some embodiments, the arrangement of pixel arrays may refer to FIG. 3B. That is, the first column 310B of the pixel array may be a second pixel column, the second column 320B may be a third pixel column (or a first pixel column), and the third column 330B may be a second pixel column. The first column 310B and the second column 320B may share the same data voltage signal line Vdata, and the second column 320B and the third column 330B may share the same reference voltage signal line Vref.

Referring to FIG. 3A and FIG. 3B, in the disclosed organic light-emitting display panel, pixel driving circuits in any column of the pixel array and an adjacent pixel column may share the same data voltage signal line or the same reference voltage signal line. Further, when the pixel array of the disclosed organic light-emitting display panel includes an m-number of pixel columns, in the second to the $(n-1)^{th}$ pixel column, the pixel driving circuits in any pixel column may share the same data voltage signal line Vdata with an adjacent pixel column and share the same reference voltage signal line Vref with another adjacent pixel column.

As such, when the pixel array of the organic light-emitting display panel includes an n-number of pixel columns, by sharing signal lines (i.e., the data voltage signal lines Vdata and the reference voltage signal lines Vref), the total number of the reference voltage signal lines Vref and the data voltage signal lines Vdata included in the display panel may be equal to (n+1).

Accordingly, the number of longitudinal wires (wires extending along the direction D2 as illustrated in FIG. 3A and FIG. 3B) of the organic light-emitting display panel may be greatly reduced. Thus, the distance between two adjacent pixel regions arranged along the first direction D1 may be configured to be shorter, thereby facilitating the implementation of the organic light-emitting display panels with high PPI.

Figure 4A:
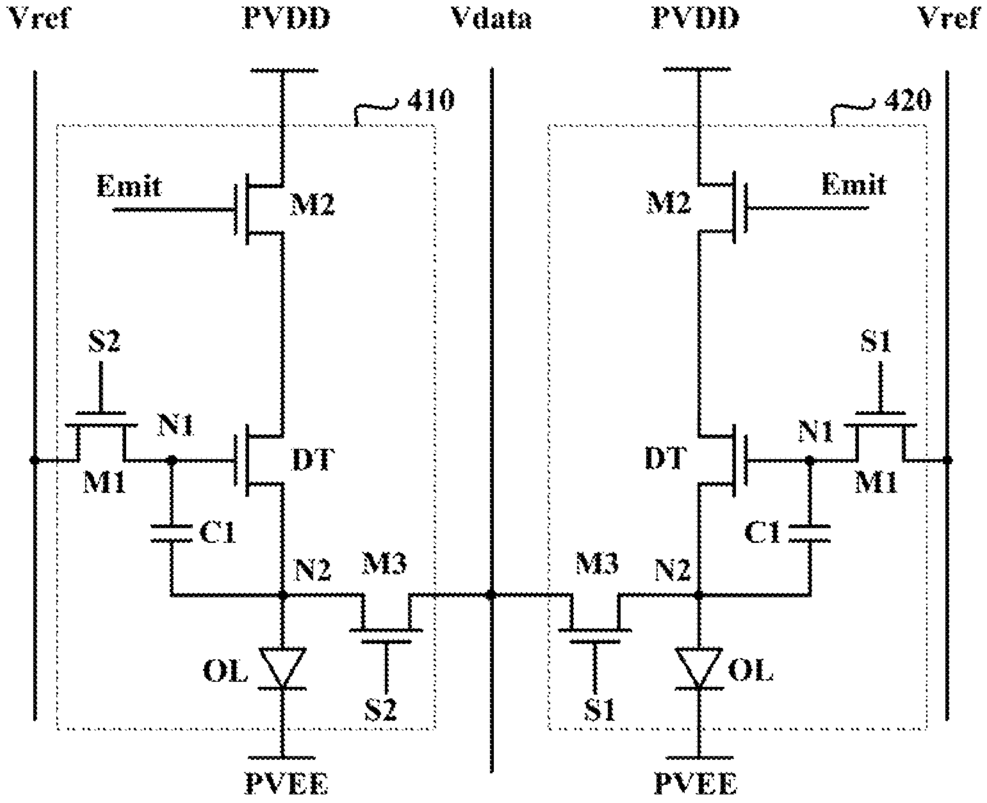
FIG. 4A illustrates a schematic circuit diagram of two pixel driving circuits sharing one data voltage signal line in an organic light-emitting display panel according to embodiments of the present disclosure.

FIG. 4A illustrates a schematic circuit diagram of two pixel driving circuits sharing one data voltage signal line in an organic light-emitting display panel according to embodiments of the present disclosure. As shown in FIG. 4A, the organic light-emitting display panel may include a pixel driving circuit 410 and a pixel driving circuit 420. The pixel driving circuit 410 and the pixel driving circuit 420 may be the aforementioned second pixel driving circuit and the third pixel driving circuit, respectively. Further, the pixel driving circuit 410 and the pixel driving circuit 420 may share a data voltage signal line Vdata, and may each be connected to a reference voltage signal line Vref.

More specifically, the pixel driving circuit 410 and the pixel driving circuit 420 may each include a first transistor M1, a second transistor M2, a third transistor M3, a driving transistor DT, and a first capacitor C1. For example, in the pixel driving circuit 410, a gate electrode of the first transistor M1 may be electrically connected to a second control signal line S2, a first electrode of the first resistor M1 may be electrically connected to a reference voltage signal line Vref, and a second electrode of the first transistor M1 may be electrically connected to a gate electrode of the driving transistor DT.

Further, a gate electrode of the second transistor M2 may be electrically connected to a light-emitting control signal line Emit, a first electrode of the second transistor M2 may be electrically connected to a first voltage signal line PVDD, and a second electrode of the second transistor M2 may be electrically connected to a first electrode of the driving transistor DT. A second electrode of the driving transistor DT may be electrically connected to a second electrode of the third transistor M3 and an anode of the light-emitting diode OL.

Further, a first electrode of the third transistor M3 may be electrically connected to a data voltage signal line Vdata, and a gate electrode of the third transistor M3 may be electrically connected to the second control signal line S2. Two plates of the first capacitor C1 may be electrically connected to the gate electrode of the driving transistor DT and the second electrode of the third transistor M3. A cathode of the light-emitting diode DL may be electrically connected to a second voltage signal line PVEE.

The pixel driving circuit 420 may have a very similar structure to the pixel driving circuit 410 as described above. The difference between the pixel driving circuit 410 and the pixel driving circuit 420 may lie in that in the pixel driving circuit 420, a gate electrode of the first transistor M1 may be electrically connected to a first control signal line S1, and a gate electrode of the third transistor M3 may also be electrically connected to the first control signal line S1. The rest structure of the pixel driving circuit 420 may then refer to the structure of the pixel driving circuit 410, and is not repeatedly described herein.

Figure 4B:
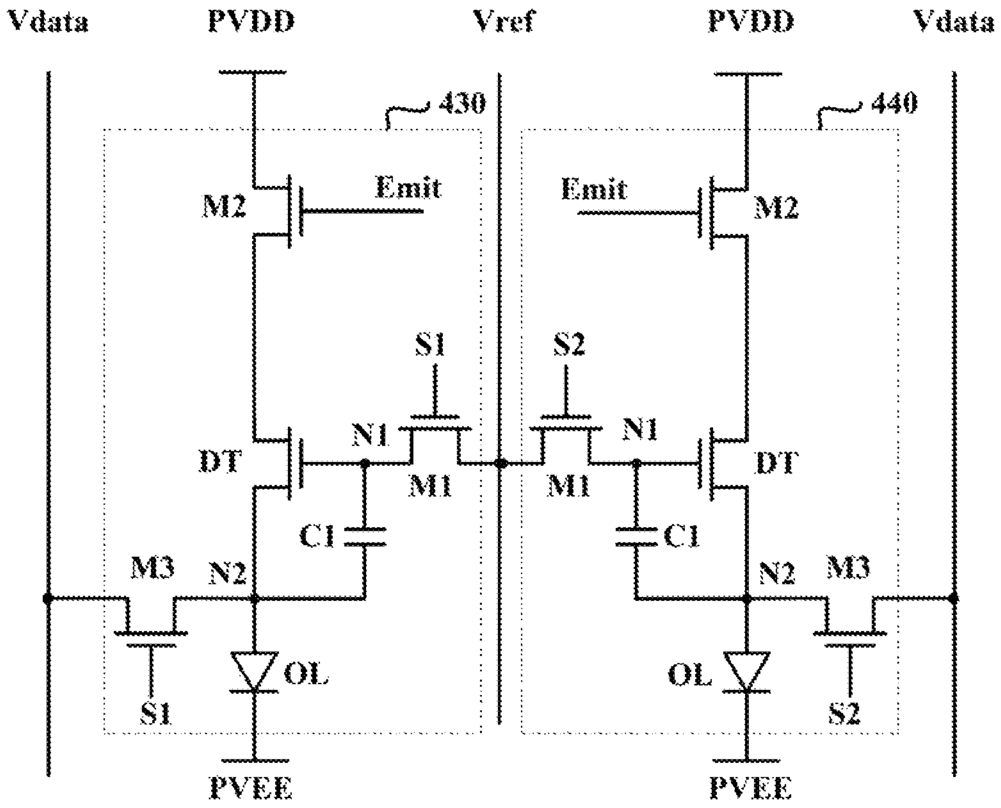
FIG. 4B illustrates a schematic circuit diagram of two pixel driving circuits sharing one reference voltage signal line in an organic light-emitting display panel according to embodiments of the present disclosure.

FIG. 4B illustrates a schematic circuit diagram of two pixel driving circuits sharing one reference voltage signal line in an organic light-emitting display panel according to embodiments of the present disclosure. As shown in FIG. 4B, the organic light-emitting display panel may include a pixel driving circuit 430 and a pixel driving circuit 440.

The pixel driving circuit 430 and the pixel driving circuit 440 may be the aforementioned first pixel driving circuit and the second pixel driving circuit, respectively. Further, the pixel driving circuit 430 and the pixel driving circuit 440 may share a reference voltage signal line Vref, and may each be connected to a data voltage signal line Vdata.

The specific structure of the pixel driving circuit 430 in FIG. 4B may be the same as or similar to the structure of the pixel driving circuit 420, and is not described herein. The specific structure of the pixel driving circuit 440 in FIG. 4B may be the same as or similar to the structure of the pixel driving circuit 410, and is not described herein.

Further, referring to FIG. 4A, in the disclosed organic light-emitting display panel, two pixel driving circuits (e.g., the pixel driving circuit 410 and the pixel driving circuit 420) that share the same data voltage signal line Vdata may be mirror-symmetric with respect to the data voltage signal line shared by the two pixel driving circuits. Similarly, referring to FIG. 4B, two pixel driving circuits (e.g., the pixel driving circuit 430 and the pixel driving circuit 440) that share the same reference voltage signal line may be mirror-symmetric with respect to the reference voltage signal line shared by the two pixel driving circuits.

As such, in the disclosed organic light-emitting display panel, the wires in each pixel driving circuit may be configured to be relatively short. Accordingly, the mutual interference between wires inside the pixel driving circuit may be reduced and the layout area occupied by the pixel driving circuit may be further decreased, thereby facilitating the implementation of organic light-emitting display panel with high PPI.

Further, in the first pixel driving circuit (e.g., the pixel driving circuit 430 in FIG. 4B) and the third pixel driving circuit (e.g., the pixel driving circuit 420 in FIG. 4A) of the disclosed organic light-emitting display panel, the gate electrode of the first transistor M1 and the gate electrode of the third transistor M3 may be electrically connected to the first control signal line S1.

Further, in the second pixel driving circuit (e.g., the pixel driving circuit 410 in FIG. 4A or the pixel driving circuit 440 in FIG. 4B) of the disclosed organic light-emitting display panel, the gate electrode of the first transistor M1 and the gate electrode of the third transistor M3 may be electrically connected to the second control signal line S2.

Figure 5A:
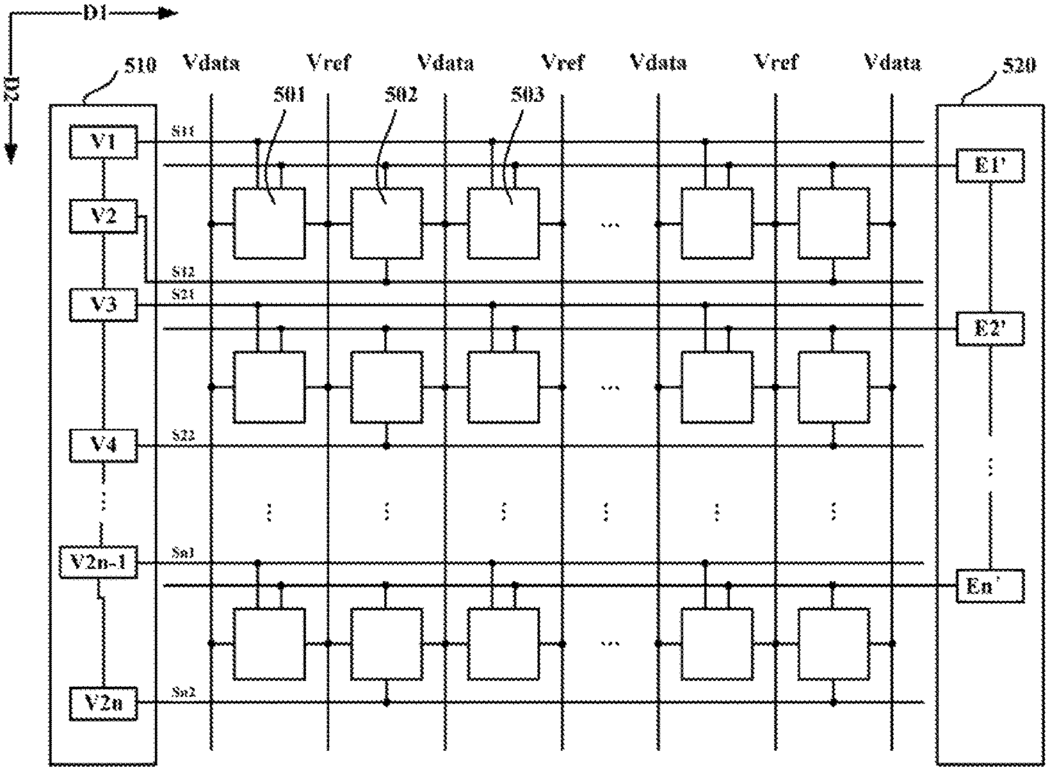
FIG. 5A illustrates another exemplary organic light-emitting display panel according to embodiments of the present disclosure.

FIG. 5A illustrates another exemplary organic light-emitting display panel according to embodiments of the present disclosure. Different from the organic light-emitting display panel illustrated in FIG. 3A, the disclosed organic light-emitting display panel in FIG. 5A may further include a shift register 510. The shifter register 510 may include a plurality of cascade-connected shift register units V1~V2*n*. Optionally, the organic light-emitting display panel may further include a light-emitting control shift register 520.

Further, each shift register unit of the shift register 510 may be, for example, electrically connected to one of a plurality of first control signal lines (S11, S21, . . . , Sn1) and/or a plurality of second control signal lines (S12, S22, . . . , Sn2). In one embodiment, as shown in FIG. 5A, the shift register unit V1 may be electrically connected to the first control signal line S11, the shift register unit V3 may be electrically connected to the first control signal line S21, . . . , the shift register unit V2*n*−1 may be electrically connected to the first control signal line Sn1.

Further, the shift register unit V2 may be electrically connected to the second control signal line S12, the shift register unit V4 may be electrically connected to the second control signal line S22, . . . , the shift register unit V2*n* may be electrically connected to the second control signal line Sn2.

For example, a first pixel driving circuit and a third pixel driving circuit arranged in the same row along the direction D1 may be electrically connected to a same first control signal line. A second pixel driving circuit disposed in the same row as the first pixel driving circuit and the third pixel driving circuit may be electrically connected to a second control signal line.

In one embodiment, as shown in FIG. 5A, the organic light-emitting display panel may include a first pixel driving circuit 501, a second pixel driving circuit 502, and a third pixel driving circuit 503 disposed in the first row of the pixel array. The first pixel driving circuit 501 and the third pixel driving circuit 503 may be electrically connected to the first control signal line S11 (i.e., an output end of the shift register unit V1). The second pixel driving circuit 502 may be electrically connected to the second control signal line S12 (i.e., an output end of the shift register unit V2).

Further, the light-emitting control shifter register 520 may include a plurality of cascade-connected shift register units E1'~En'. Each shift register unit of the light-emitting control shift register 520 may be configured to output a light-emitting control signal to one row of pixel driving circuits.

Optionally, in one embodiment, each shift register unit may output the light-emitting control signal to a corresponding light-emitting control signal line that is electrically connected to one row of pixel driving circuit. Accordingly, by configuring the shift register 510 and the light-emitting control shift register 520 to output control signals, the organic light-emitting display panel may realize display row by row.

Figure 5B:
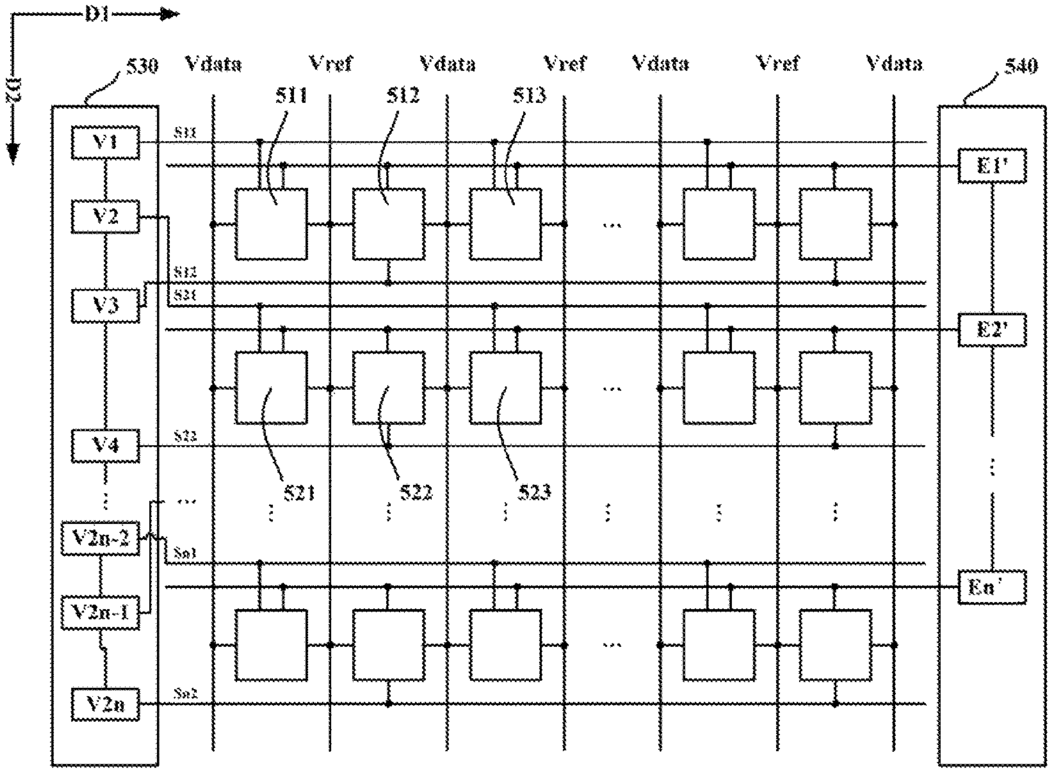
FIG. 5B illustrates an optional implementation of an exemplary organic light-emitting display panel in FIG. 5A.

FIG. 5B illustrates another exemplary organic light-emitting display panel according to embodiments of the present disclosure. As shown in FIG. 5B, similar to FIG. 5A, the organic light-emitting display panel may include a pixel array, a plurality of pixel driving circuits, a plurality of reference voltage signal lines Vref, and a plurality of data voltage signal lines Vdata.

The organic light-emitting display panel may further include a plurality of first control signal lines (S11, S21, . . . , Sn1), and a plurality of second control signal lines (S12, S22, . . . , Sn2). Optionally, the organic light-emitting display panel may further include a plurality of light-emitting control signal lines.

Further, the organic light-emitting display panel may further include a shift register 530, and a light-emitting control shift register 540. The shifter register 530 may include a plurality of cascade-connected shift register units V1~V2*n*, and the light-emitting control shifter register 540 may include a plurality of cascade-connected light-emitting control shift register units E1'~En'.

As shown in FIG. 5B, a $k^{th}$ shift register unit may be configured to supply a first control signal to a first control signal line connected to an $i^{th}$ row of pixel driving circuits. A $(k+1)^{th}$ shift register may be configured to supply a first control signal line connected to an $(i+1)^{th}$ row of pixel driving circuits, where k is an integer, and $1 \le i \le n-1$. In particular, a may refer to the row number of the pixel array in the disclosed organic light-emitting display panel.

Optionally, a $(k+2)^{th}$ shift register may be configured to supply a second control signal line connected to the $i^{th}$ row of pixel driving circuits. A $(k+3)^{th}$ shift register may be configured to supply a second control signal line connected to the (i+1)$^{th}$ row of pixel driving circuits.

In one embodiment, as shown in FIG. 5B, the organic light-emitting display panel may include a first pixel driving circuit 511, a second pixel driving circuit 512, and a third pixel driving circuit 513 disposed in the first row of pixel array. The organic light-emitting display panel may further include a first pixel driving circuit 521, a second pixel driving circuit 522, and a third pixel driving circuit 523 disposed in the second row of pixel array.

More specifically, in the first row of the pixel array of the organic light-emitting display panel, the first pixel driving circuit 511 and the third pixel driving circuit 513 may be electrically connected to the first control signal line S11 (i.e., an output end of the shift register unit V1). Further, the second pixel driving circuit 512 in the second row may be electrically connected to the second control signal line S12 (i.e., an output end of the shift register unit V3).

Further, in the second row of the pixel array of the organic light-emitting display panel, the first pixel driving circuit 521 and the third pixel driving circuit 523 may be electrically connected to the first control signal line S21 (i.e., an output end of the shift register unit V2). Further, the second pixel driving circuit 522 in the second row may be electrically connected to the second control signal line S22 (i.e., an output end of the shift register unit V4).

Figure 5C:
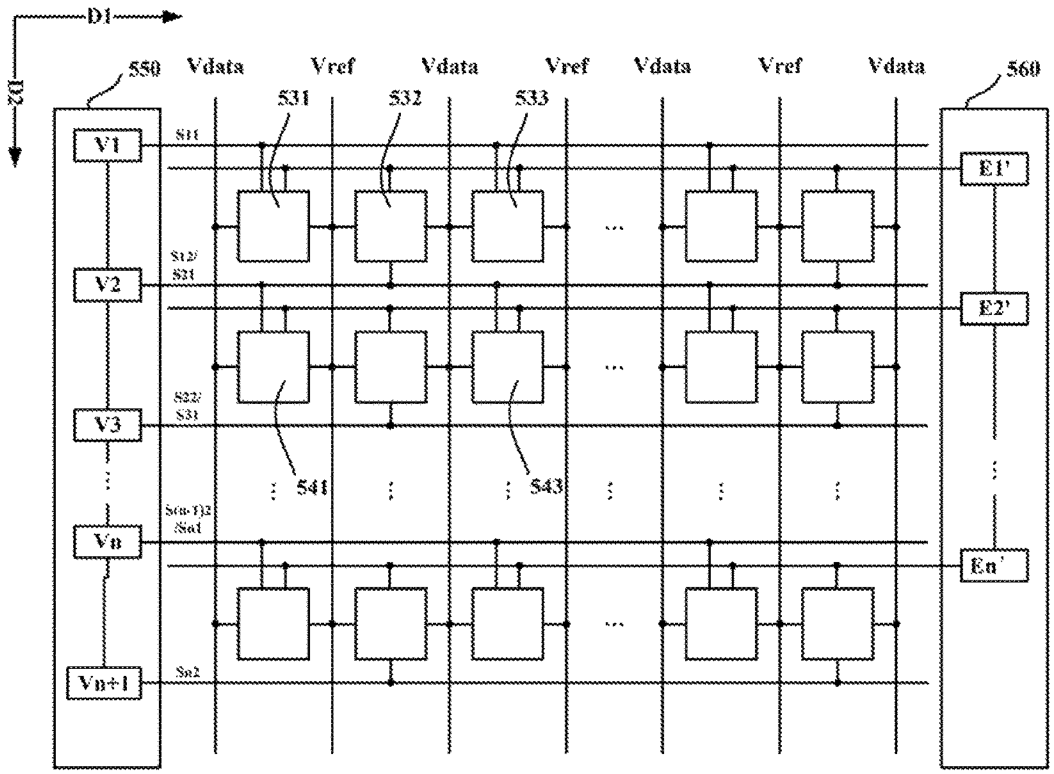
FIG. 5C illustrates another optional implementation of an exemplary organic light-emitting display panel in FIG. 5A.

FIG. 5C illustrates another exemplary organic light-emitting display panel according to embodiment of the present disclosure. As shown in FIG. 5C, similar to FIG. 5A, the organic light-emitting display panel may include a pixel array, a plurality of pixel driving circuits, a plurality of reference voltage signal lines Vref, and a plurality of data voltage signal lines Vdata.

The organic light-emitting display panel may further include a plurality of first control signal lines (S11, S21, . . . , Sn1), and a plurality of second control signal lines (S12, S22, . . . , Sn2). Optionally, as shown in FIG. 5C, the first control signal line S(i+1)1 connected to an (i+1)$^{th}$ row of the pixel driving circuits may be multiplexed as the second control signal line S12 connected to an i$^{th}$ row of the pixel driving circuits.

Further, the organic light-emitting display panel may further include a shift register 550, and a light-emitting control shift register 560. The shift register 550 may include a plurality of shift register units V1~Vn+1, and the light-emitting control shifter register 560 may include a plurality of cascade-connected light-emitting control shift register units E1'~En'.

Further, in one embodiment, as shown in FIG. 5C, the organic light-emitting display panel may include a first pixel driving circuit 531, a second pixel driving circuit 532, and a third pixel driving circuit 533 disposed in the first row of the pixel array. The organic light-emitting display panel may further include a first pixel driving circuit 541, a second pixel driving circuit 542, and a third pixel driving circuit 543 disposed in the second row of pixel array.

More specifically, in the first row of the pixel array of the organic light-emitting display panel, the first pixel driving circuit 531 and the third pixel driving circuit 533 may be electrically connected to the first control signal line S11 (i.e., an output end of the shift register unit V1). Further, the second pixel driving circuit 532 in the second row may be electrically connected to the second control signal line S12 (i.e., an output end of the shift register unit V2).

Further, the first control signal line S21 corresponding to the second row of the pixel driving circuits may be multiplexed as the second control signal line S12 corresponding to the first row of the pixel driving circuits. Accordingly, the first pixel driving circuit 541 and the third pixel driving circuit 543 in the second row may be electrically connected to the first control signal line S21 (i.e., the output end of the shift register unit V2).

Accordingly, the number of the shift register units in the shift register 550 may be greatly reduced. For example, when the pixel array of the organic light-emitting display panel includes an n-number of rows of pixel regions, the shift register 550 may only need (n+1) shift register units (i.e., V1~Vn+1).

Thus, the number of electric or electronic elements in the shift register 550 may be greatly reduced, thereby further reducing the layout area occupied by the shift register 550. Because the shift register 550 is often disposed in a non-display region of the organic light-emitting display panel, the reduction in the layout area occupied by the shift register 550 may facilitate the implementation of narrow frame of organic light-emitting display panels.

Figure 6:
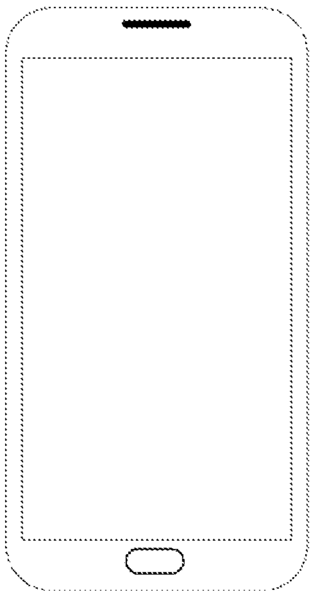
FIG. 6 illustrates another exemplary organic light-emitting display device according to embodiments of the present disclosure.

FIG. 6 illustrates another exemplary organic light-emitting display device according to embodiments of the present disclosure. As shown in FIG. 6, the organic light-emitting display device 600 may include any of the aforementioned organic light-emitting display panel. The organic light-emitting display device 600 may be, for example, a cell phone, a tablet, or a wearable device, etc. Optionally, the organic light-emitting display device 600 may further include a structure such as an encapsulation film, and a protecting glass, etc.

Further, the disclosed organic light-emitting display panel may be applied to a top-emission type organic light-emitting display panel or a bottom-emission type organic light-emitting display panel. Accordingly, the organic light-emitting display device 600 may be a top-emission type organic light-emitting display device or a bottom-emission type organic light-emitting display device.

Figure 7:
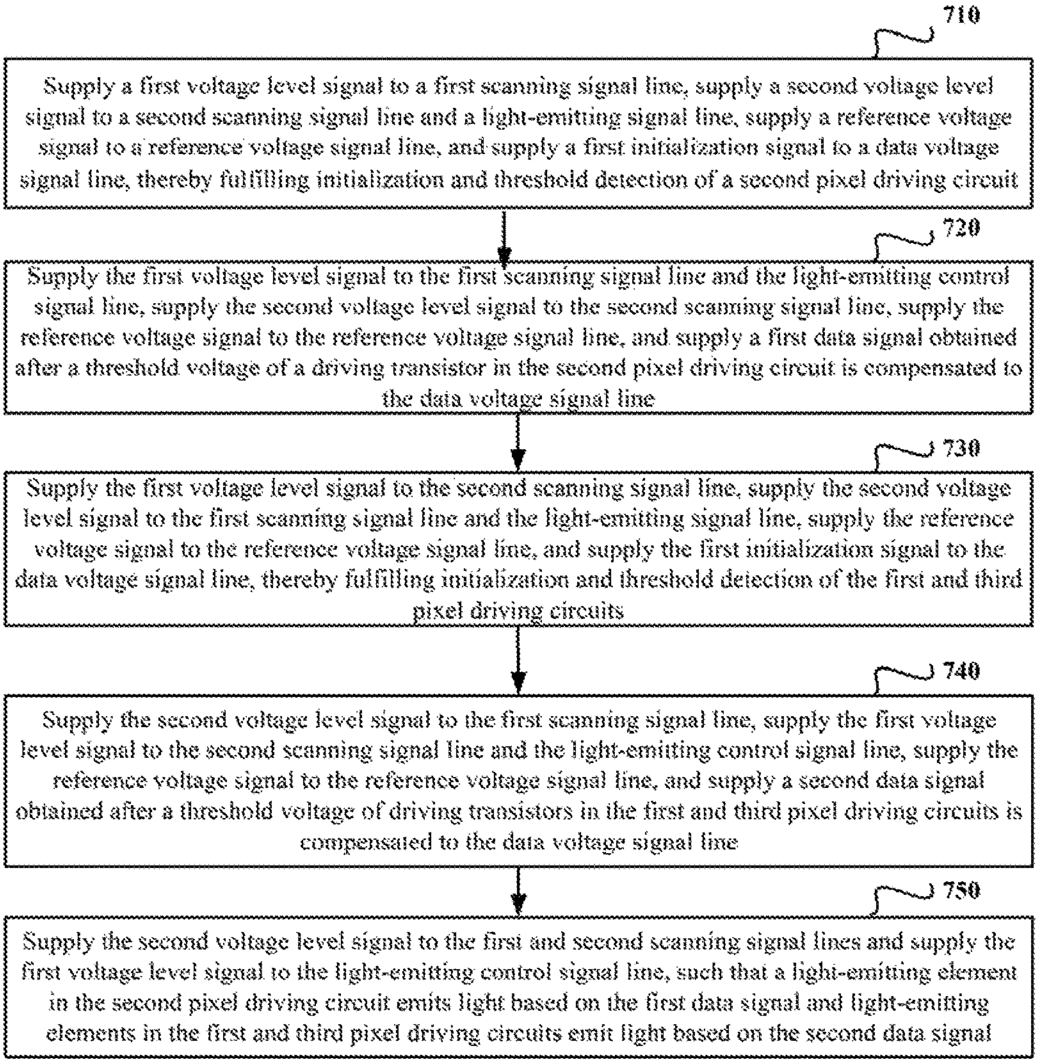
FIG. 7 illustrates a flow chart of an exemplary driving method according to embodiments of the present disclosure.

Further, the present disclosure also provides a driving method of an organic light-emitting display panel. The driving method may be configured to drive any aforementioned organic light-emitting display panel. FIG. 7 illustrates a flow chart of an exemplary driving method according to embodiments of the present disclosure. As shown in FIG. 7, the driving method may include the following steps (Step 710~Step 750).

Step 710: In the first stage, a first voltage level signal may be supplied to a first control signal line (also known as first scanning signal line), and a second voltage level signal may be supplied to a second control signal line (also known as second scanning signal line) and a light-emitting control signal line. Further, in the first stage, a reference voltage signal may be supplied to a reference voltage signal line, and a first initialization signal may be supplied to a data voltage signal line. Accordingly, the initialization and threshold detection of the second pixel driving circuit may be fulfilled.

Step 720: In the second stage, the first voltage level signal may be supplied to the first control signal line and the light-emitting control signal line, and the second voltage level signal may be supplied to the second control signal line. Further, in the second stage, the reference voltage signal may be supplied to the reference voltage signal line, and a first data signal obtained after a threshold voltage of a driving transistor in the second pixel driving circuit is compensated may be supplied to the data voltage signal line.

Step 730: In the third stage, the second voltage level signal may be supplied to the first control signal line and the light-emitting control signal line, and the first voltage level signal may be supplied to the second control signal line.

Further, in the third stage, the reference voltage signal may be supplied to the reference voltage signal line, and the first initialization signal may be supplied to the data voltage signal line. Accordingly, the initialization and threshold detection of the first and third pixel driving circuits may be fulfilled.

Step 740: In the fourth stage, the second voltage level signal may be supplied to the first control signal line, and the first voltage level signal may be supplied to the second control signal line and the light-emitting control signal line. Further, in the fourth stage, the reference voltage signal may be supplied to the reference voltage signal line, and a second data signal obtained after threshold voltage of driving transistors in the first pixel driving circuit and the third pixel driving circuit is compensated may be supplied to the data voltage signal line.

Step 750: In the fifth stage, the second voltage level signal may be supplied to the first control signal line and the second control signal line, and the first voltage level signal may be supplied to the light-emitting control signal line. Further, a light-emitting element in the second pixel driving circuit may emit light based on the first data signal. The light-emitting elements in the first pixel driving circuit and the third pixel driving circuit may emit light based on the second data signal.

Figure 8:
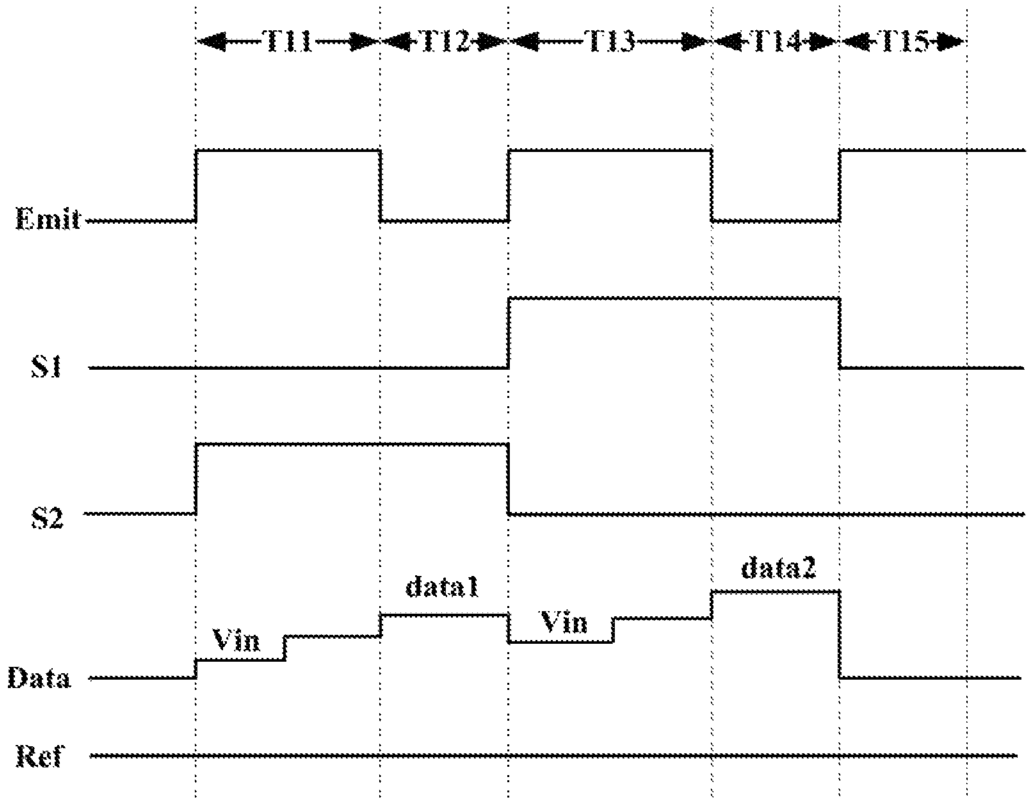
FIG. 8 illustrates an exemplary timing sequence diagram of a driving method in FIG. 7.

FIG. 8 illustrates an exemplary timing sequence diagram of a driving method in FIG. 7. Herein after the operational process of the disclosed driving method is illustrated in detail with reference to FIG. 4. Further, the first voltage level may be assumed to be a low voltage level, the second voltage level may be assumed to be a high voltage level, and all transistors in the pixel driving circuits may be assumed as N-type transistors (e.g., NMOS transistors).

As shown in FIG. 8, the timing sequence may include a first stage T11, a second stage T12, a third stage T13, a fourth stage T14, and a fifth stage T15. More specifically, the first stage T11 may correspond to a detection stage of a threshold voltage Vth1 of the driving transistor DT in the pixel driving circuit 410 illustrated in FIG. 4A. For example, the pixel driving circuit 410 may be a second pixel driving circuit, as mentioned previously.

In the first stage T11, a first voltage level signal may be supplied to the first control signal line S1, thereby turning off the first transistor M1 and the third transistor M3 in the pixel driving circuit 420. A second voltage level signal may be supplied to the second control signal line S2 and the light-emitting control signal line Emit, thereby turning on the first transistor M1, the second transistor M2, and the third transistor M3 in the pixel driving circuit 410.

Further, a reference voltage signal VRef may be supplied to the reference voltage signal line Vref, and a first initialization signal Vin may be supplied to the data voltage signal line Vdata. In particular, a voltage difference between the reference voltage signal VRef and the transistor DT in the pixel driving circuit 410.

Because the first transistor M1 in the pixel driving circuit 410 is turned on, the voltage level at a node N1 in the pixel driving circuit 410 may be equal to Vref (i.e., VN1=VRef). Accordingly, the driving transistor DT in the pixel driving circuit 410 may be turned on. Further, the first voltage signal line PVDD may be configured to charge the first electrode (i.e., node N2) of the driving transistor DT in the pixel driving circuit 410. Once the voltage level of the node N2 reaches a value of VRef−Vth1, the driving transistor DT in the pixel driving circuit 410 may be turned off, and the first voltage signal line PVDD may stop charging.

Further, the data voltage signal line Vdata may be configured to collect the voltage level VN2 (=VRef−Vth1) of the first electrode (i.e., the node N2) of the driving transistor DT in the pixel driving circuit 410. Accordingly, the threshold voltage Vth1 of the driving transistor DT in the pixel driving circuit 410 may be determined.

Because VRef is a given voltage level, the threshold voltage Vth1 of the driving transistor DT in the pixel driving circuit 410 may be calculated. Accordingly, the initialization and threshold detection of the pixel driving circuit 410 may be fulfilled.

The second stage T12 may correspond to a data signal write-in stage of the pixel driving circuit 410. In the second stage T12, the first voltage level signal may be supplied to the first control signal line S1 and the light-emitting control signal line Emit, thereby turning off the first transistor M1, the second transistor M2, and the third transistor in the pixel driving circuit 420. Further, the second transistor M2 in the pixel driving circuit 410 may be simultaneously turned off.

In the second stage T12, the second voltage level signal may be supplied to the second control signal line S2, thereby turning on the first transistor M1 and the third transistor M3 in the pixel driving circuit 410. Further, the reference voltage signal VRef may be supplied to the reference voltage signal line Vref, and a first data signal data1 obtained after the threshold voltage Vth1 of the driving transistor DT in the pixel driving circuit 410 is compensated may be supplied to the data voltage signal line Vdata.

Because the first transistor M1 in the pixel driving circuit 410 is turned on, the reference voltage signal VRef may be transmitted to a gate electrode (node N1) of the driving transistor DT in the pixel driving circuit 410. Because the third transistor M3 in the pixel driving circuit 410 is turned on, the first data signal data1 may be transmitted to the first electrode (node N2) of the driving transistor DT in the pixel driving circuit 410. By then, the voltage level at the node N1 may be equal to Vref (i.e., VN1=VRef), and the voltage level at the node N2 may be equal to VN2 (i.e., VN2=data1).

The third stage T13 may correspond to a detection stage of a threshold voltage Vth2 of the driving transistor DT in the pixel driving circuit 420 illustrated in FIG. 4A. In the third stage T13, the second voltage level signal may be supplied to the first control signal line S1 and the light-emitting control signal line Emit. Accordingly, the first transistor M1, the second transistor M2, and the third transistor M3 in the pixel driving circuit 420 may be turned on.

In the third stage T13, the first voltage level signal may be supplied to the second control signal line S2, thereby turning off the first transistor M1 and the third transistor M3 in the pixel driving circuit 410. The reference voltage signal VRef may be supplied to the reference voltage signal line Vref, and the first initialization signal Vin may be supplied to the data voltage signal line Vdata.

Because the first transistor M1 in the pixel driving circuit 420 is turned on, the voltage level at a node N1 in the pixel driving circuit 420 may be equal to Vref (i.e., VN1=VRef). Accordingly, the driving transistor DT in the pixel driving circuit 420 may be turned on. Further, the first voltage signal line PVDD may be configured to charge the first electrode (i.e., node N2) of the driving transistor DT in the pixel driving circuit 420. Once the voltage level of the node N2 reaches a value of VRef−Vth2, the driving transistor DT in the pixel driving circuit 410 may be turned off, and the first voltage signal line PVDD may stop charging.

Further, the data voltage signal line Vdata may be configured to collect the voltage level VN2 (=VRef−Vth1) of the first electrode (i.e., the node N2) of the driving transistor DT in the pixel driving circuit 420. Accordingly, the threshold voltage Vth2 of the driving transistor DT in the pixel driving circuit 420 may be determined.

Because VRef is a given voltage level, the threshold voltage Vth2 of the driving transistor DT in the pixel driving circuit 420 may be calculated. Accordingly, the initialization and threshold detection of the pixel driving circuit 420 may be fulfilled.

The fourth stage T14 may correspond to a data signal write-in stage of the pixel driving circuit 420. In the fourth stage T14, the first voltage level signal may be supplied to the first control signal line S2 and the light-emitting control signal line Emit, thereby turning off the first transistor M1, the second transistor M2, and the third transistor in the pixel driving circuit 410. Further, the second transistor M2 in the pixel driving circuit 420 may be simultaneously turned off.

In the fourth stage T14, the second voltage level signal may be supplied to the second control signal line S1, thereby turning on the first transistor M1 and the third transistor M3 in the pixel driving circuit 420. Further, the reference voltage signal VRef may be supplied to the reference voltage signal line Vref, and a first data signal data1 obtained after the threshold voltage Vth2 of the driving transistor DT in the pixel driving circuit 420 is compensated may be supplied to the data voltage signal line Vdata.

Because the first transistor M1 in the pixel driving circuit 420 is turned on, the reference voltage signal VRef may be transmitted to a gate electrode (node N1) of the driving transistor DT in the pixel driving circuit 420. Because the third transistor M3 in the pixel driving circuit 420 is turned on, the first data signal data1 may be transmitted to the first electrode (node N2) of the driving transistor DT in the pixel driving circuit 420. By then, the voltage level at the node N1 may be equal to Vref (i.e., VN1=VRef), and the voltage level at the node N2 may be equal to VN2 (i.e., VN2=data2).

The fifth stage T15 may correspond to a light-emitting stage. In the fifth stage T15, the first voltage level signal may be supplied to the first control signal line S1 and the second control signal line S2. The second voltage level signal may be supplied to the light-emitting control signal line Emit. Further, a light-emitting element in the second pixel driving circuit may emit light based on the first data signal. The light-emitting elements in the first pixel driving circuit and the third pixel driving circuit may emit light based on the second data signal.

Accordingly, the light-emitting element OL in the pixel driving circuit 410 and the light-emitting element OL in the pixel driving circuit 420 may emit light based on the first data signal data and the second data signal data2. More specifically, the light-emitting current of the light-emitting element OL in the pixel driving circuit 410 may be equal to $I1=K1\times(VN1-VN2)^2=K1\times(VRef-data1)^2$.

Similarly, the light-emitting current of the light-emitting element OL in the pixel driving circuit 420 may be equal to $I2=K2\times(VN1-VN2)^2=K2\times(VRef-data2)^2$. In particular, the light-emitting element OL may be a light-emitting diode. Further, K1 and K2 may be a coefficient related to the width-to-length ratio of the driving transistor DT in the pixel driving circuit 410 and a coefficient related to the width-to-length ratio of the driving transistor DT in the pixel driving circuit 420, respectively.

In the aforementioned first stage T11 and the second stage T112, the first control signal line S1 may be configured to transmit the first voltage level signal, thereby turning off the third transistor M3 in the pixel driving circuit 420. Accordingly, in the first stage T11 or the second stage T12, the pixel driving circuit 420 may not affect the signal carried by the data voltage signal line Vdata.

That is, the threshold voltage Vth1 of the driving transistor DT in the pixel driving circuit 410 collected by the data voltage signal line Vdata may not be interfered by the pixel driving circuit 420. Further, the first data signal transmitted by the data voltage signal line Vdata to the first electrode (node N2) of the driving transistor DT in the pixel driving circuit 410 may not be affected by the pixel driving circuit 420.

Similarly, in the aforementioned third stage T13 and the fourth stage T14, the collection of the threshold voltage of the driving transistor DT in the pixel driving circuit 420 and the write-in of the second data signal may not be affected by the pixel driving circuit 410.

Further, from aforementioned descriptions, the driving method illustrated in FIG. 7 may utilize an external circuit to compensate the threshold voltage of the driving transistor DT, and the working status of the reference voltage signal line Vref may remain unchanged from the first stage to the fifth stage. In practical applications, a constant reference voltage Vref may be supplied to the reference voltage signal line Vref, and the data voltage signal line Vdata may be configured to time-sharingly collect and compensate the threshold voltage of the pixel driving circuits electrically connected to the data voltage signal line Vdata. Accordingly, the load caused by the switch of the working status of the reference voltage signal line may be reduced.

Further, because the reference voltage signal line no longer needs to switch the working status, the plurality of reference voltage signal lines connected to the plurality of pixel driving circuits may be connected to the same terminal of the driving chip. Accordingly, the number of the terminals occupied by the plurality of reference voltage signal lines may be reduced, thereby facilitating the terminal design of the driving chip.

Optionally, prior to the first stage T11, the timing sequence may further include a stage T10. In the stage T10, the first voltage level signal may be supplied to the second control signal line S2 and the light-emitting control signal line Emit, thereby turning off the first transistor M1, the second transistor M2, and the third transistor M3 in the pixel driving circuit 410. Further, the second transistor M2 in the pixel driving circuit 420 may be also turned off. The second voltage level signal may be supplied to the first control signal line S1, thereby turning on the first transistor M1 and the third transistor M3 in the pixel driving circuit 420.

Further, in the stage T10, the reference voltage signal VRef may be supplied to the reference voltage signal line Vref, and a data signal data0 may be supplied to the data voltage signal line Vdata. Accordingly, the voltage level at the node N1 may be equal to Vref, and the voltage level at the node N2 may be equal to data0.

Figure 9:
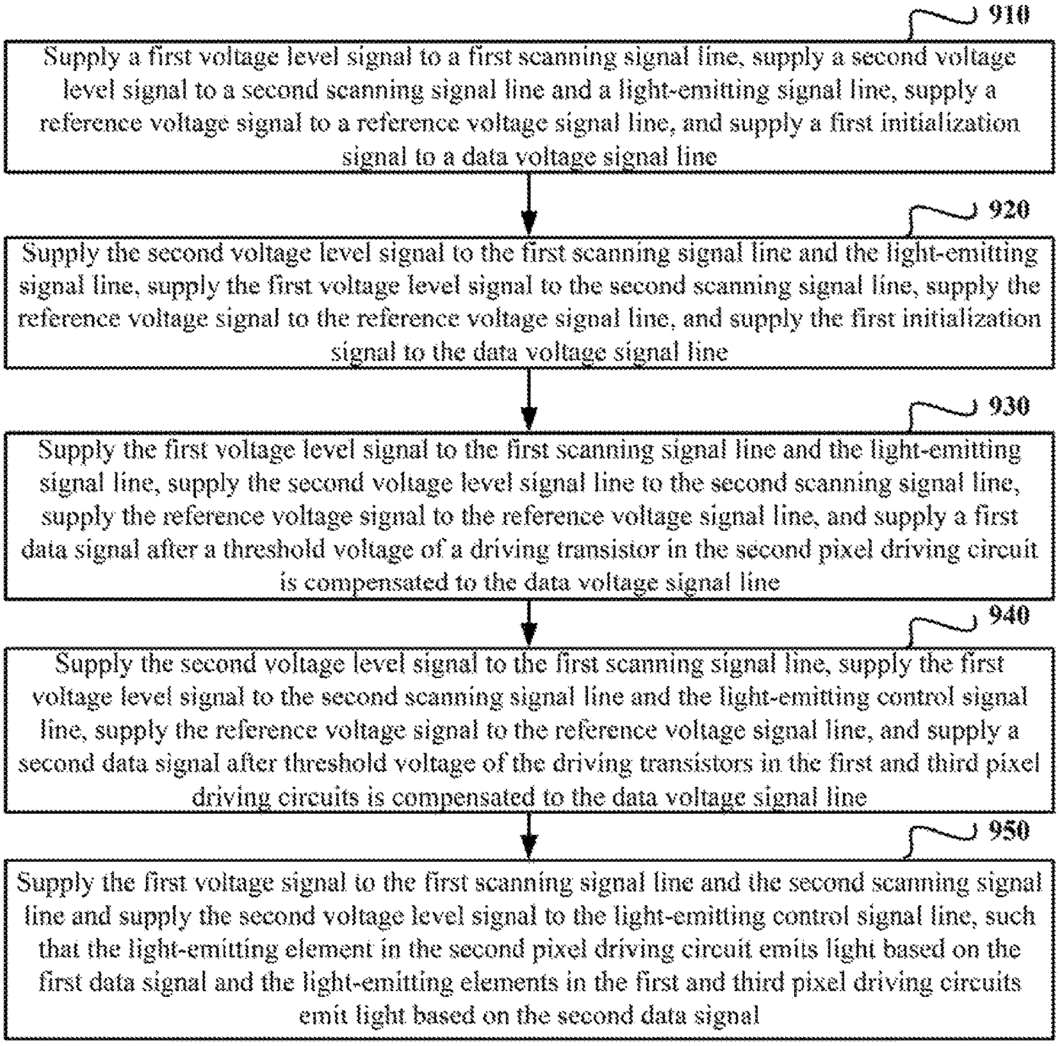
FIG. 9 illustrates a flow chart of another exemplary driving method according to embodiments of the present disclosure.

FIG. 9 illustrates a flow chart of another exemplary driving method according to embodiments of the present disclosure. The driving method illustrated in FIG. 9 may be also applied to drive the aforementioned organic light-emitting display panel. As shown in FIG. 9, the driving method may include the following steps.

Step 910: In the first collection phase of the threshold detection stage, a first voltage level signal may be supplied to a first control signal line (all known as a first scanning signal line), and a second voltage level signal may be supplied to a second control signal line (also known as second scanning signal line) and a light-emitting control signal line. Further, a reference voltage signal may be supplied to a reference voltage signal line, and a first initialization signal may be supplied to a data voltage signal line. Accordingly, the initialization and threshold detection of the second pixel driving circuit may be fulfilled.

Step 920: In the second collection phase of the threshold detection stage, the second voltage level signal may be supplied to the first control signal line and the light-emitting control signal line, and the first voltage level signal may be supplied to the second control signal line. Further, the reference voltage signal may be supplied to the reference voltage signal line, and the first initialization signal may be supplied to the data voltage signal line. Accordingly, the initialization and threshold detection of the first and third pixel driving circuits may be fulfilled.

Through the aforementioned first collection phase and the second collection phase, the threshold voltage of the driving transistors in the first pixel driving circuit, the second pixel driving circuit and the third pixel driving circuit may be collected, respectively. Further, in some embodiments, the driving method may further include the following steps.

Step 930: In the first data signal write-in phase of the display stage, the first voltage level signal may be supplied to the first control signal line and the light-emitting control signal line, and the second voltage level signal may be supplied to the second control signal line. Further, the reference voltage signal may be supplied to the reference voltage signal line, and a first data signal obtained after threshold voltage of a driving transistor in the second pixel driving circuit is compensated may be supplied to the data voltage signal line.

Step 940: In the second data signal write-in phase of the display stage, the second voltage level signal may be supplied to the first control signal line, and the first voltage level signal may be supplied to the second control signal line and the light-emitting control signal line. Further, the reference voltage signal may be supplied to the reference voltage signal line, and a second data signal obtained after threshold voltage of driving transistors in the first pixel driving circuit and the third pixel driving circuit is compensated may be supplied to the data voltage signal line.

Step 950: In the light-emitting phase of the display stage, the first voltage level signal may be supplied to the first control signal line and the second control signal line, and the second voltage level signal may be supplied to the light-emitting control signal line. The light-emitting element in the second pixel driving circuit may emit light based on the first data signal. The light-emitting elements in the first pixel driving circuit and the third pixel driving circuit may emit light based on the second data signal.

Figure 10:
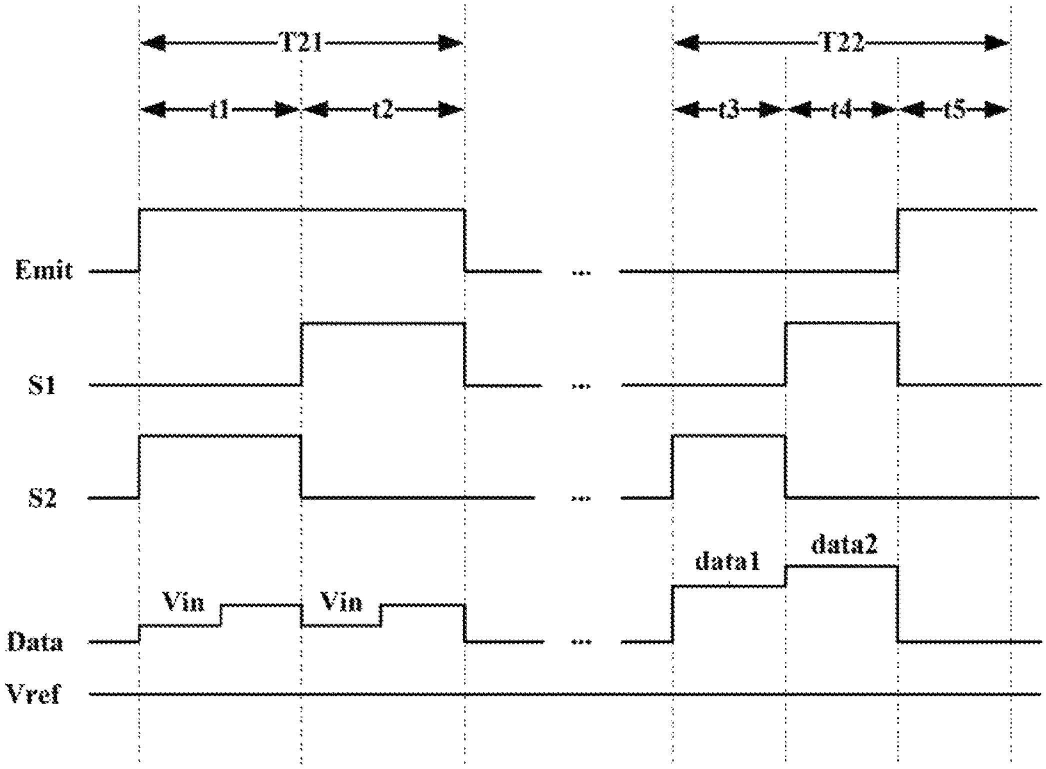
FIG. 10 illustrates an exemplary timing sequence diagram of a driving method in FIG. 9.

FIG. 10 illustrates an exemplary timing sequence diagram of a driving method in FIG. 9. Thus, the operational process of the disclosed driving method is described in detail with reference to the structural schematic view shown in FIG. 4A and the timing sequence illustrated in FIG. 10. Hereinafter, the first voltage level may be assumed to be a low voltage level, the second voltage level may be assumed to be a high voltage level, and all transistors in the pixel driving circuits may be assumed as N-type transistors (e.g., NMOS transistors) for illustrative purpose.

As shown in FIG. 10, the timing sequence may include a threshold detection stage T21 and a display stage T22. The threshold detection stage T21 may further include a first collection phase t1 and a second collection phase t2. The display stage T22 may further include a first data signal write-in phase t3, a second data signal write-in phase t4, and a light-emitting phase t5.

In the first collection phase t1 of the threshold detection stage T21, a first voltage level signal may be supplied to the first control signal line S1, thereby turning off the first transistor M1 and the third transistor M3 in the pixel driving circuit 420. A second voltage level signal may be supplied to the second control signal line S2 and the light-emitting control signal line Emit, thereby turning on the first transistor M1, the second transistor M2, and the third transistor M3 in the pixel driving circuit 410.

Further, a reference voltage signal VRef may be supplied to the reference voltage signal line Vref, and a first initialization signal Vin may be supplied to the data voltage signal line Vdata. In particular, a voltage difference between the reference voltage signal VRef and the first initialization signal Vin may be greater than the threshold voltage Vth of the driving transistor DT in the pixel driving circuit 410.

Because the first transistor M1 in the pixel driving circuit 410 is turned on, the voltage level at a node N1 in the pixel driving circuit 410 may be equal to VRef (i.e., VN1=VRef). Accordingly, the driving transistor DT in the pixel driving circuit 410 may be turned on. Further, the first voltage signal line PVDD may be configured to charge the first electrode (i.e., node N2) of the driving transistor DT in the pixel driving circuit 410. Once the voltage level of the node N2 reaches a value of VRef−Vth1, the driving transistor DT in the pixel driving circuit 410 may be turned off, and the first voltage signal line PVDD may stop charging.

Further, the data voltage signal line Vdata may be configured to collect the voltage level VN2 (=VRef−Vth1) of the first electrode (i.e., the node N2) of the driving transistor DT in the pixel driving circuit 410. Accordingly, the threshold voltage Vth1 of the driving transistor DT in the pixel driving circuit 410 may be determined.

Because VRef is a given voltage level, the threshold voltage Vth1 of the driving transistor DT in the pixel driving circuit 410 may be calculated. Further, the detected threshold voltage Vth1 of the driving transistor DT in the pixel driving circuit 410 may be stored in a memory. The memory may be, for example, an internal memory in the organic light-emitting display panel.

In the second collection phase t2 of the threshold detection stage T21, the second voltage level signal may be supplied to the first control signal line S1 and the light-emitting control signal line Emit. Accordingly, the first transistor M1, the second transistor M2, and the third transistor M3 in the pixel driving circuit 420 may be turned on. The first voltage level signal may be supplied to the second control signal line S2, thereby turning off the first transistor M1 and the third transistor M3 in the pixel driving circuit 410. The reference voltage signal VRef may be supplied to the reference voltage signal line Vref, and the first initialization signal Vin may be supplied to the data voltage signal line Vdata.

Because the first transistor M1 in the pixel driving circuit 420 is turned on, the voltage level at a node N1 in the pixel driving circuit 420 may be equal to Vref (i.e., VN1=VRef). Accordingly, the driving transistor DT in the pixel driving circuit 420 may be turned on. Further, the first voltage signal line PVDD) may be configured to charge the first electrode (i.e., node N2) of the driving transistor DT in the pixel driving circuit 420. Once the voltage level of the node N2 reaches a value of VRef−Vth2, the driving transistor DT in the pixel driving circuit 410 may be turned off, and the first voltage signal line PVDD may stop charging.

Further, the data voltage signal line Vdata may be configured to collect the voltage level VN2 (=VRef−Vth1) of the first electrode (i.e., the node N2) of the driving transistor DT in the pixel driving circuit 420, such that the threshold voltage Vth2 of the driving transistor DT in the pixel driving circuit 420 may be determined. More specifically, because VRef is a given voltage level, the threshold voltage Vth2 of the driving transistor DT in the pixel driving circuit 420 may be calculated. Further, the detected threshold voltage Vth2 of the driving transistor DT in the pixel driving circuit 420 may also be stored in the memory.

As such, through the aforementioned threshold detection stage T21, the threshold voltage of the driving transistors in the first pixel driving circuit, the second pixel driving circuit, and the third pixel driving circuit may be detected.

Optionally, prior to the first collection phase t1 of the threshold detection stage T21, the timing sequence may further include a phase t0. In the phase t0, the first voltage level signal may be supplied to the second control signal line S2 and the light-emitting control signal line Emit, thereby turning off the first transistor M1, the second transistor M2, and the third transistor M3 in the pixel driving circuit 410. Further, the second transistor M2 in the pixel driving circuit 420 may be also turned off. The second voltage level signal may be supplied to the first control signal line S1, thereby turning on the first transistor M1 and the third transistor M3 in the pixel driving circuit 420.

Further, in the phase t0, the reference voltage signal VRef may be supplied to the reference voltage signal line Vref, and a data signal data0 may be supplied to the data voltage signal line Vdata. Accordingly, the voltage level at the node N1 may be equal to Vref, and the voltage level at the node N2 may be equal to data0.

In the first data signal write-in phase t3 of the display stage T22, the first voltage level signal may be supplied to the first control signal line S1 and the light-emitting control signal line Emit, thereby turning off the first transistor M1, the second transistor M2, and the third transistor in the pixel driving circuit 420. Correspondingly, the second transistor M2 in the pixel driving circuit 410 may be simultaneously turned off.

Further, in the first data signal write-in phase t3, the second voltage level signal may be supplied to the second control signal line S2, thereby turning on the first transistor M1 and the third transistor M3 in the pixel driving circuit 410. The reference voltage signal VRef may be supplied to the reference voltage signal line Vref, and a first data signal data1 obtained after the threshold voltage Vth1 of the driving transistor DT in the pixel driving circuit 410 is compensated may be supplied to the data voltage signal line Vdata.

Because the first transistor M1 in the pixel driving circuit 410 is turned on, the reference voltage signal VRef may be transmitted to a gate electrode (node N1) of the driving transistor DT in the pixel driving circuit 410. Because the third transistor M3 in the pixel driving circuit 410 is turned on, the first data signal data1 may be transmitted to the first electrode (node N2) of the driving transistor DT in the pixel driving circuit 410. By then, the voltage level at the node N1 may be equal to Vref (i.e., VN1=VRef), and the voltage level at the node N2 may be equal to VN2 (i.e., VN2=data1).

In the second data signal write-in phase t4 of the display stage 122, the first voltage level signal may be supplied to the first control signal line S2 and the light-emitting control signal line Emit, thereby turning off the first transistor M1, the second transistor M2, and the third transistor in the pixel driving circuit 410. Correspondingly, the second transistor M2 in the pixel driving circuit 420 may be simultaneously turned off.

Further, in the second data signal write-in phase t4, the second voltage level signal may be supplied to the second control signal line S1, thereby turning on the first transistor M1 and the third transistor M3 in the pixel driving circuit 420. The reference voltage signal VRef may be supplied to the reference voltage signal line Vref, and a first data signal data1 obtained after the threshold voltage Vth2 of the driving transistor DT in the pixel driving circuit 420 is compensated may be supplied to the data voltage signal line Vdata.

Because the first transistor M1 in the pixel driving circuit 420 is turned on, the reference voltage signal VRef may be transmitted to a gate electrode (node N1) of the driving transistor DT in the pixel driving circuit 420. Because the third transistor M3 in the pixel driving circuit 420 is turned on, the first data signal data1 may be transmitted to the first electrode (node N2) of the driving transistor DT in the pixel driving circuit 420. By then, the voltage level at the node N1 may be equal to Vref (i.e., VN1=VRef), and the voltage level at the node N2 may be equal to VN2 (i.e., VN2=data2).

In the light-emitting phase t5 of display stage T22, the first voltage level signal may be supplied to the first control signal line S1 and the second control signal line S2, thereby turning off the first transistors M1 and the third transistors M3 in the pixel driving circuits 410 and 420. The second voltage level signal may be supplied to the light-emitting control signal line Emit, thereby turning on the second transistors M2 in the pixel driving circuits 410 and 420. Further, the light-emitting element OL in the pixel driving circuit 410 may emit light based on the first data signal data1. The light-emitting elements in the pixel driving circuit 420 may emit light based on the second data signal data2.

That is, the light-emitting element OL in the pixel driving circuit 410 and the light-emitting element OL in the pixel driving circuit 420 may emit light based on the first data signal data1 and the second data signal data2. More specifically, the light-emitting current of the light-emitting element OL in the pixel driving circuit 410 may be equal to $I1=K1\times(VN1-VN2)^2=K1\times(VRef-data1)^2$.

Similarly, the light-emitting current of the light-emitting element OL in the pixel driving circuit 420 may be equal to $I2=K2\times(VN1-VN2)^2=K2\times(VRef-data2)^2$. In particular, the light-emitting element OL may be a light-emitting diode. Further, K1 and K2 may be a coefficient related to the width-to-length ratio of the driving transistor DT in the pixel driving circuit 410 and a coefficient related to the width-to-length ratio of the driving transistor DT in the pixel driving circuit 420, respectively.

Optionally, prior to the data signal write-in phase t3 of the display stage 122, the timing sequence may further include a phase t0'. In the phase t0', the first voltage level signal may be supplied to the second control signal line S2 and the light-emitting control signal line Emit, thereby turning off the first transistor M1, the second transistor M2, and the third transistor M3 in the pixel driving circuit 410. Further, the second transistor M2 in the pixel driving circuit 420 may be also turned off. The second voltage level signal may be supplied to the first control signal line S1, thereby turning on the first transistor M1 and the third transistor M3 in the pixel driving circuit 420.

Further, in the phase t0', the reference voltage signal VRef may be supplied to the reference voltage signal line Vref, and a data signal data0 may be supplied to the data voltage signal line Vdata. Accordingly, the voltage level at the node N1 may be equal to Vref, and the voltage level at the node N2 may be equal to data0.

In the aforementioned first threshold detection phase 11 and the first data write-in phase t3, the first control signal line S1 may be configured to transmit the first voltage level signal, thereby turning off the third transistor M3 in the pixel driving circuit 420. Accordingly, in the first stage T11 or the second stage T12, the pixel driving circuit 420 may not affect the signal carried by the data voltage signal Vdata.

That is, the threshold voltage Vth1 of the driving transistor DT in the pixel driving circuit 410 collected by the data voltage signal line Vdata may not be interfered by the pixel driving circuit 420. Further, the first data signal transmitted by the data voltage signal line to the first electrode (node N2) of the driving transistor DT in the pixel driving circuit 410 may not be affected by the pixel driving circuit 420.

Similarly, in the aforementioned second threshold detection phase t2 and the 10 second data write-in phase t4, the collection of the threshold voltage of the driving transistor DT in the pixel driving circuit 420 and the write-in of the second data signal may not be affected by the pixel driving circuit 410.

Further, the aforementioned threshold detection stage T21 may be applied to detect the threshold voltage of each transistor in the display panel when the power supply of the organic light-emitting display panel is turned on. Further, the detection threshold voltage may be stored in a memory in a form of list. In the display stage T22, the threshold voltage of driving transistors in each pixel driving circuit may be looked up in the memory, thereby determining corresponding data signal after the threshold voltage is compensated.

Optionally, the threshold voltage may be detected for only once after the power supply is turned on, and detection of the threshold voltage may thus be no longer needed when displaying each frame of images. Accordingly, the disclosed driving method not only reduces the load of the reference voltage signal line and decreases the number of terminals occupied by the reference voltage signal lines, but also provide more time for the display stage of each frame of images. Thus, each node in the pixel driving circuit may be ensured to be charged to a sufficient voltage level, and the stability of the display image may be improved.

Further, the time needed for displaying each frame of image may be shortened. Accordingly, the display scanning of more pixel driving circuits may be fulfilled in a unit time, thereby improving the resolution of the organic light-emitting display panel.

It should be noted that, the above detailed descriptions illustrate only preferred embodiments of the present disclosure and technologies and principles applied herein. Those skilled in the art can understand that the present disclosure is not limited to the specific embodiments described herein, and numerous significant alterations, modifications and alternatives may be devised by those skilled in the art without departing from the scope of the present disclosure. Thus, although the present disclosure has been illustrated in above-described embodiments in details, the present disclosure is not limited to the above embodiments. Any equivalent or modification thereof, without departing from the spirit and principle of the present invention, falls within the true scope of the present invention, and the scope of the present disclosure is defined by the appended claims.

What is claimed is:

1. An organic light-emitting display panel, comprising:

a pixel array including a plurality of pixel regions;

a plurality of pixel driving circuits including, along a row direction of the pixel array, a first pixel driving circuit, a second pixel driving circuit, and a third pixel driving circuit in a preset order, wherein the first and the second pixel driving circuits share a same reference voltage signal line, and the second and the third pixel driving circuits share a same data voltage signal line;

a plurality of reference voltage signal lines configured to provide a reference voltage signal to the plurality of pixel driving circuits;

a plurality of data voltage signal lines configured to provide a data signal to the plurality of pixel driving circuits;

a first control signal line connected to the first and third pixel driving circuits;

a second control signal line connected to the second pixel driving circuit;

a light-emitting control signal line connected to the first, the second, and the third pixel driving circuits, each pixel driving circuit of the plurality of pixel driving circuits includes a first transistor, a second transistor and a third transistor, in the first pixel driving circuit and the third pixel driving circuit, a gate electrode of the first transistor and a gate electrode of the third transistor are connected to the first control signal line, and in the second pixel driving circuit, a gate electrode of the first transistor and a gate electrode of the third transistor are connected to the second control signal line.

2. The organic light-emitting display panel according to claim 1, wherein:

each pixel driving circuit of the plurality of pixel driving circuits includes a light-emitting element disposed in a corresponding pixel region;

based on a first control signal carried by the first control signal line and a light-emitting control signal carried by the light-emitting control signal line, the first and the third pixel driving circuits are configured to receive a reference voltage signal and a data signal to control light-emitting elements in the first and the third pixel driving circuits to emit light, and based on a second control signal carried by the second control signal line and the light-emitting control signal carried by the light-emitting control signal line, the second pixel driving circuit is configured to receive a reference voltage signal and a data signal to control a light-emitting element in the second pixel driving circuit to emit light.

3. The organic light-emitting display panel according to claim 2, wherein:

the pixel array includes a plurality of pixel columns comprising a first pixel column, a second pixel column, and a third pixel column, the first pixel driving circuit is configured to drive a pixel region in the first pixel column, the second pixel driving circuit is configured to drive a pixel region in the second pixel column, and the third pixel driving circuit is configured to drive a pixel region in the third pixel column.

4. The organic light-emitting display panel according to claim 3, wherein:

any pixel column in the pixel array is a first pixel column, a second pixel column, or a third pixel column, and a first pixel column is not adjacent to a third pixel column.

5. The organic light-emitting display panel according to claim 1, wherein:

a pixel driving circuit further includes a driving transistor, a first voltage signal line, and a second voltage signal line, a first electrode of the first transistor is connected to a reference voltage signal line, and a second electrode of the first transistor is connected to a gate electrode of the driving transistor, a gate electrode of the second transistor is connected to a light-emitting control signal line, a first electrode of the second transistor is connected to the first voltage signal line, and a second electrode of the second transistor is connected to a first electrode of the driving transistor, a second electrode of the driving transistor is connected to an anode of a light-emitting element, wherein the driving transistor is configured to drive the light-emitting element, a first electrode of the third transistor is connected to a data voltage signal line, and a second electrode of the third transistor is connected to the second electrode of the driving transistor, and a cathode of the light-emitting element is connected to the second voltage signal line.

6. The organic light-emitting display panel according to claim 5, wherein:

the pixel driving circuit further includes a first capacitor connected between the gate electrode and the second electrode of the driving transistor.

7. The organic light-emitting display panel according to claim 1, further comprising:

a plurality of first control signal lines;

a plurality of second control signal lines; and a shift register including a plurality of shift register units, a shift register unit being connected to at least one of a first control signal line and a second control signal line, wherein a plurality of first pixel driving circuits and a plurality of third pixel driving circuits in a same row are connected to a same first control signal line, and a plurality of second pixel driving circuit in a same row are connected to a same second control signal line.

8. The organic light-emitting display panel according to claim 7, wherein:

a $k^{th}$ shift register unit is configured to supply a first control signal to a first control signal line in an $i^{th}$ row, and a $(k+1)^{th}$ shift register unit is configured to supply a first control signal to a first control signal line in an $(i+1)^{th}$ row, where k and i are positive integers.

9. The organic light-emitting display panel according to claim 8, further comprising:

the first control signal line in the $(i+1)^{th}$ row is multiplexed as a second control signal line in the $i^{th}$ row.

10. The organic light-emitting display panel according to claim 7, further comprising:

an $j^{th}$ shift register unit is configured to supply a second control signal to a second control signal line in an $i^{th}$ row, and an $(j+1)^{th}$ shift register unit is configured to supply a second control signal to a second control signal line in an $(i+1)^{th}$ row, where j and i are positive integers.

11. An organic light-emitting display device, comprising the organic light-emitting display panel according to claim 1.

12. The organic light-emitting display device according to claim 11, wherein:

each pixel driving circuit of the plurality of pixel driving circuits includes a light-emitting element disposed in a corresponding pixel region;

based on a first control signal carried by the first control signal line and a light-emitting control signal carried by the light-emitting control signal line, the first and third pixel driving circuits are configured to receive a reference voltage signal and a data signal to control light-emitting elements in the first and third pixel driving circuits to emit light, and based on a second control signal carried by the second control signal line and the light-emitting control signal carried by the light-emitting control signal line, the second pixel driving circuit is configured to receive a reference voltage signal and a data signal to control a light-emitting element in the second pixel driving circuit to emit light.

13. The organic light-emitting display device according to claim 12, wherein:

the organic light-emitting display device is a top-emission type organic light-emitting display device.

14. The organic light-emitting display device according to claim 12, wherein:

the organic light-emitting display device is a bottom-emission type organic light-emitting display device.

15. A driving method of an organic light-emitting display panel, wherein the organic light-emitting display panel includes a first pixel driving circuit, a second pixel driving circuit, a third pixel driving circuit, a plurality of reference voltage signal lines connected to the first, the second and the third pixel driving circuits, a plurality of data voltage signal lines connected to the first, the second and the third pixel driving circuits, a first control signal line connected to the first and the third pixel driving circuits, a second control signal line connected to the second pixel driving circuit, and a light-emitting control signal line connected to the first, the second, and the third pixel driving circuits, the driving method comprising:

supplying a reference voltage signal to the plurality of reference voltage signal lines, in a first stage, supplying a first voltage level signal to the first control signal line, supplying a second voltage level signal to the second control signal line and the light-emitting signal line, and supplying a first initialization signal to the plurality of data voltage signal lines, such that initialization and threshold detection of the second pixel driving circuit is fulfilled; and in a second stage, supplying the first voltage level signal to the first control signal line and the light-emitting control signal line, supplying the second voltage level signal to the second control signal line, and supplying a first data signal obtained after a threshold voltage of a driving transistor in the second pixel driving circuit is compensated to the plurality of data voltage signal line.

16. The driving method according to claim 15, further comprising:

in a third stage, supplying the first voltage level signal to the second control signal line, supplying the second voltage level signal to the first control signal line and the light-emitting signal line, and supplying the first initialization signal to the plurality of data voltage signal lines, such that initialization and threshold detection of the first and third pixel driving circuits is fulfilled;

in a fourth stage, supplying the second voltage level signal to the first control signal line, supplying the first voltage level signal to the second control signal line and the light-emitting control signal line, and supplying a second data signal obtained after a threshold voltage of driving transistors in the first and third pixel driving circuits is compensated to the plurality of data voltage signal lines; and in a fifth stage, supplying the second voltage level signal to the first and second control signal lines and supplying the first voltage level signal to the light-emitting control signal line, such that a light-emitting element in the second pixel driving circuit emits light based on the first data signal and light-emitting elements in the first and third pixel driving circuits emit light based on the second data signal.

17. A driving method of an organic light-emitting display panel, wherein the organic light-emitting display panel includes a first pixel driving circuit, a second pixel driving circuit, a third pixel driving circuit, a plurality of reference voltage signal lines connected to the first, the second and the third pixel driving circuits, a plurality of data voltage signal lines connected to the first, the second, and the third pixel driving circuits, a first control signal line connected to the first and the third pixel driving circuits, a second control signal line connected to the second pixel driving circuit, and a light-emitting control signal line connected to the first, the second, and the third pixel driving circuits, the driving method comprising:

supplying a reference voltage signal to a plurality of reference voltage signal lines;

in a first collection phase of a threshold detection stage, supplying a first voltage level signal to the first control signal line, supplying a second voltage level signal to the second control signal line and the light-emitting signal line, and supplying a first initialization signal to the plurality of data voltage signal lines; and in a second collection phase of the threshold detection stage, supplying the second voltage level signal to the first control signal line and the light-emitting signal line, supplying the first voltage level signal to the second control signal line, and supplying the first initialization signal to the plurality of data voltage signal lines.

18. The driving method according to claim 17, further comprising:

in a first data signal write-in phase of a display stage, supplying the first voltage level signal to the first control signal line and the light-emitting signal line, supplying the second voltage level signal line to the second control signal line, and supplying a first data signal after a threshold voltage of a driving transistor in the second pixel driving circuit is compensated to the plurality of data voltage signal lines; and in a second data signal write-in phase of the display stage, supplying the second voltage level signal to the first control signal line, supplying the first voltage level signal to the second control signal line and the light-emitting control signal line, and supplying a second data signal after threshold voltage of the driving transistors in the first and third pixel driving circuits is compensated to the plurality of data voltage signal lines.

19. The driving method according to claim 18, further comprising:

in a light-emitting phase of the display stage, supplying the first voltage signal to the first control signal line and the second control signal line, and supplying the second voltage level signal to the light-emitting control signal line, such that a light-emitting element in the second pixel driving circuit emits light based on the first data signal and light-emitting elements in the first and third pixel driving circuits emit light based on the second data signal.

* * * * *